(12) United States Patent
Goebel et al.

(10) Patent No.: US 6,379,978 B2
(45) Date of Patent: Apr. 30, 2002

(54) MEMORY CELL CONFIGURATION IN WHICH AN ELECTRICAL RESISTANCE OF A MEMORY ELEMENT REPRESENTS AN INFORMATION ITEM AND CAN BE INFLUENCED BY A MAGNETIC FIELD, AND METHOD FOR FABRICATING IT

(75) Inventors: Bernd Goebel, München; Hermann Jacobs, Bruckmühl; Siegfried Schwarzl, Neubiberg, all of (DE); Emmerich Bertagnolli, Vienna (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/761,801

(22) Filed: Jan. 16, 2001

Related U.S. Application Data

(63) Continuation of application No. PCT/DE99/01958, filed on Jul. 1, 1999.

(51) Int. Cl.⁷ ................................................ H01L 21/00
(52) U.S. Cl. ............................ 438/3; 438/241; 438/242
(58) Field of Search ........................... 438/3, 241, 242, 438/142

(56) References Cited

U.S. PATENT DOCUMENTS

| | | | | |
|---|---|---|---|---|
| 6,049,405 A | * | 4/2000 | Krautschneider et al. | ... 257/329 |
| 6,153,475 A | * | 11/2000 | Hofmann et al. | ........... 438/270 |

\* cited by examiner

*Primary Examiner*—Hoai V. Ho
(74) *Attorney, Agent, or Firm*—Hernert L. Lerner; Laurence A. Greenberg; Werner H. Stemer

(57) ABSTRACT

A storage cell is described which includes a storage element whose electric resistance represents an information unit and can be influenced by a magnetic field as well as a transistor which when the information is read out allows for the corresponding storage cell to be selected from among the storage cells. To write the information unit, a write line and a bit line are provided which intersect in the area of the storage element and are able to generate the magnetic field. The storage cell is disposed between the bit line and a shared voltage supply connection. The storage cell is disposed between the bit line and the write line and the write line can coincide with a gate line that controls the transistor. The transistor is a planar or vertical transistor. The storage element and the transistor can be positioned next to or on top of each other.

5 Claims, 29 Drawing Sheets

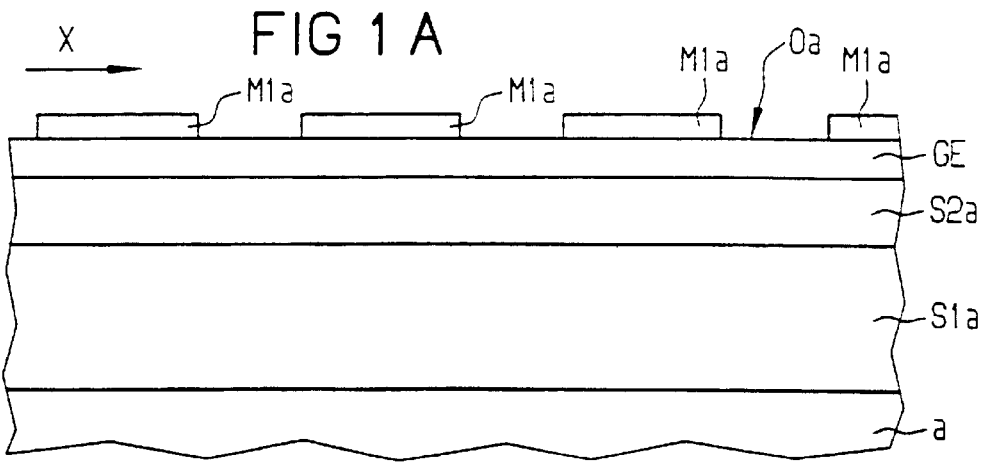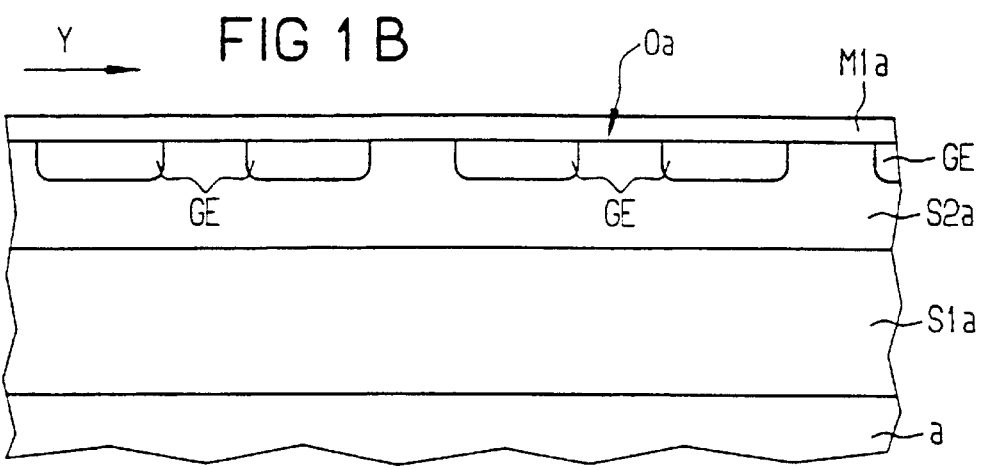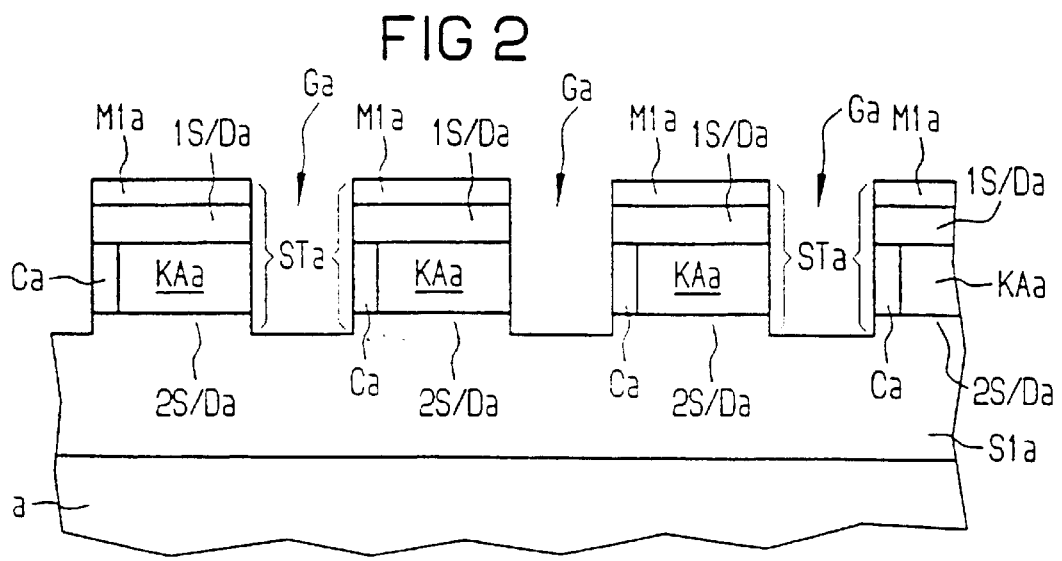

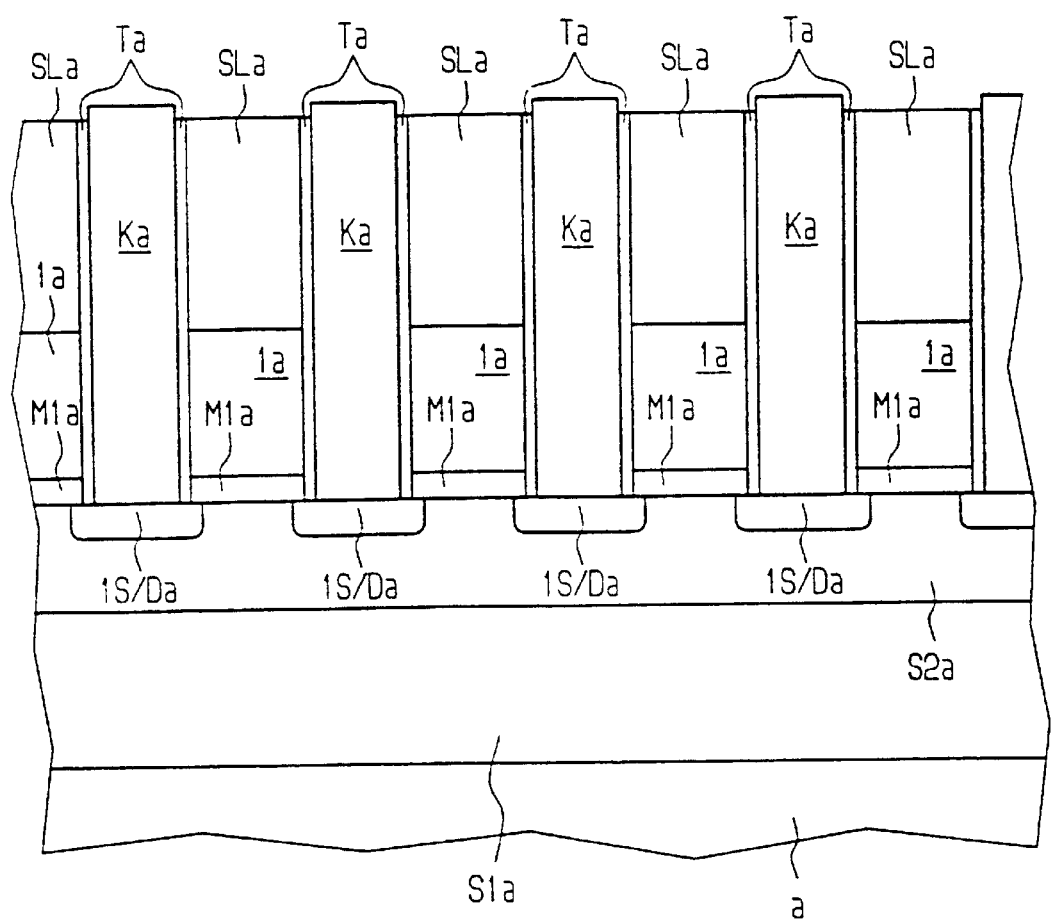

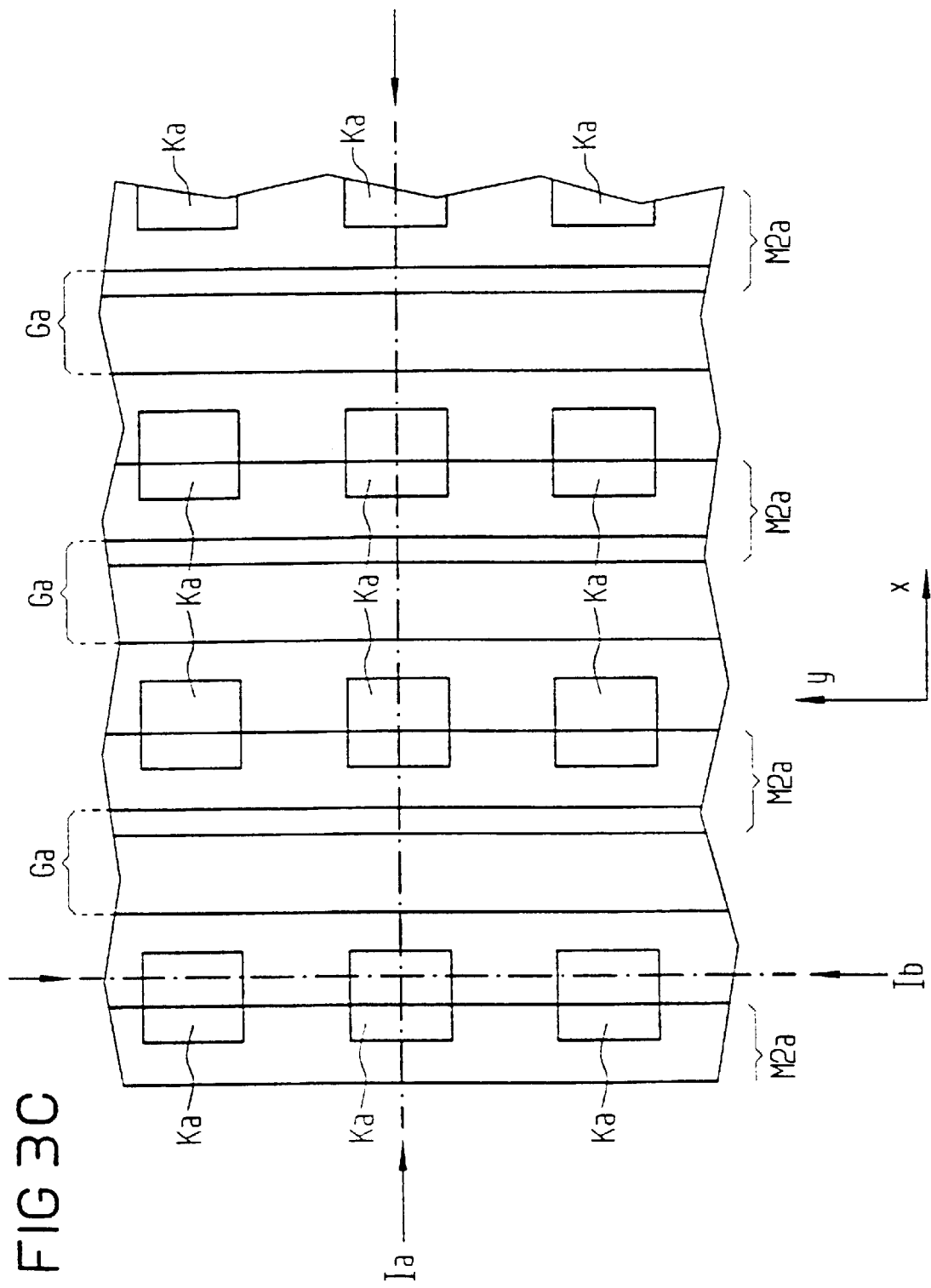

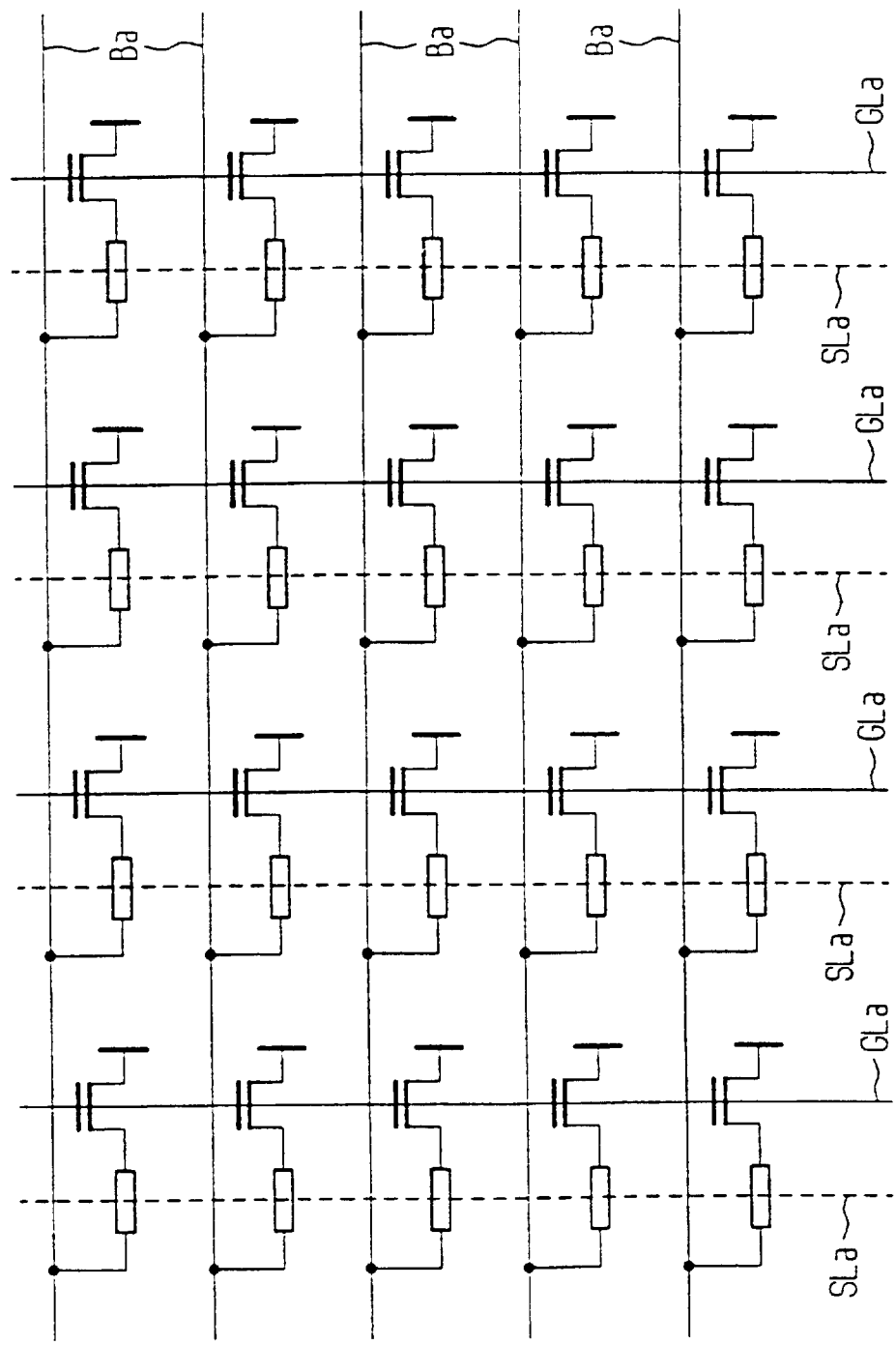

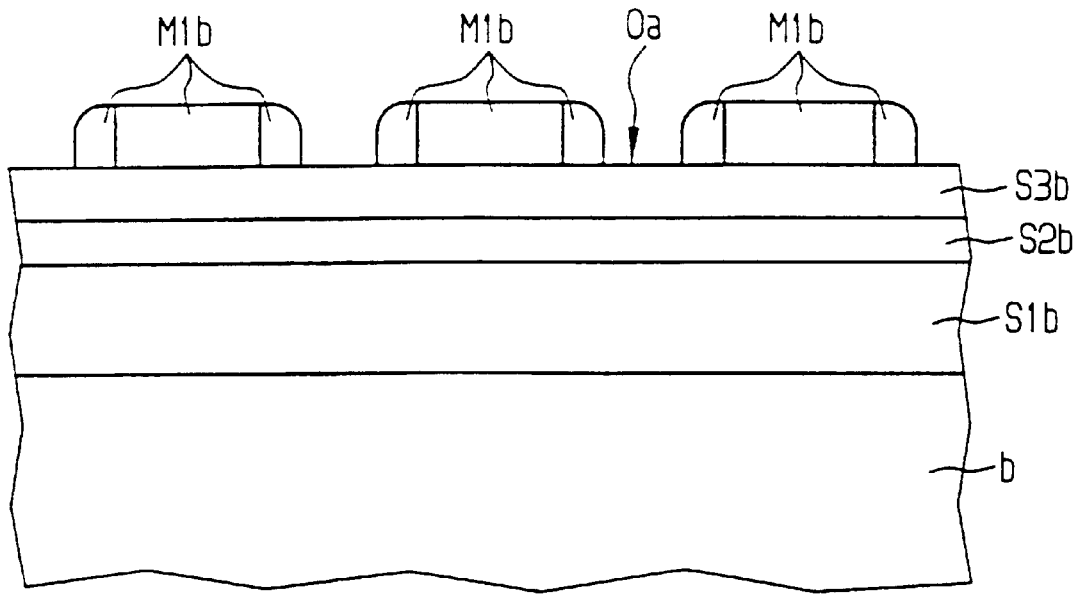
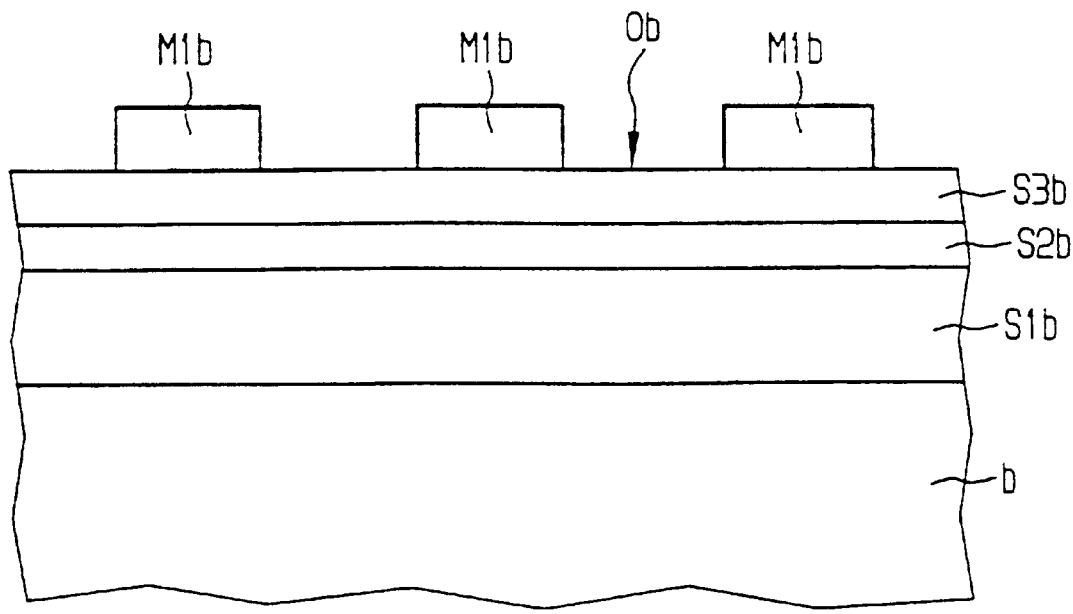

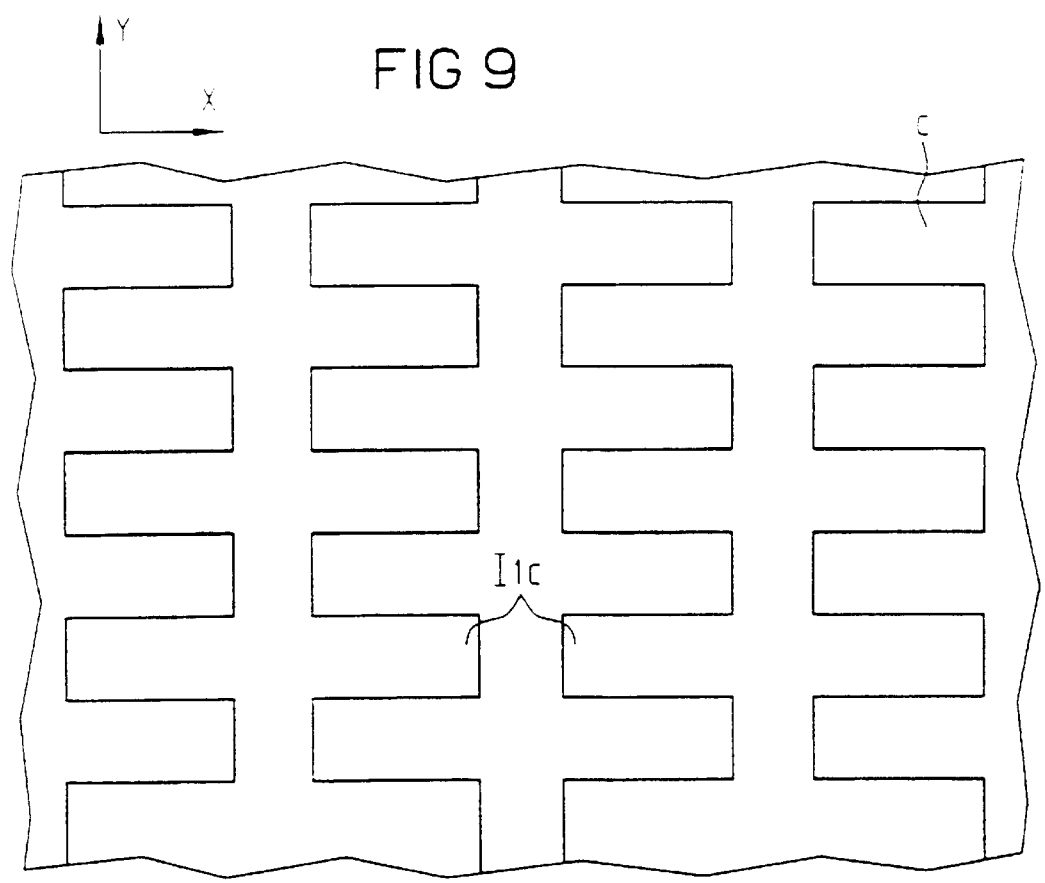
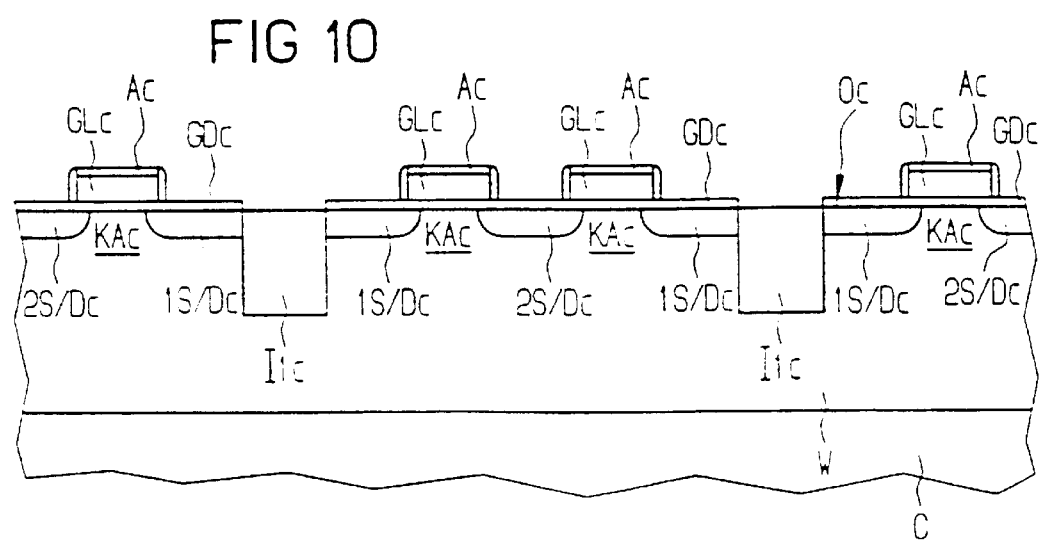

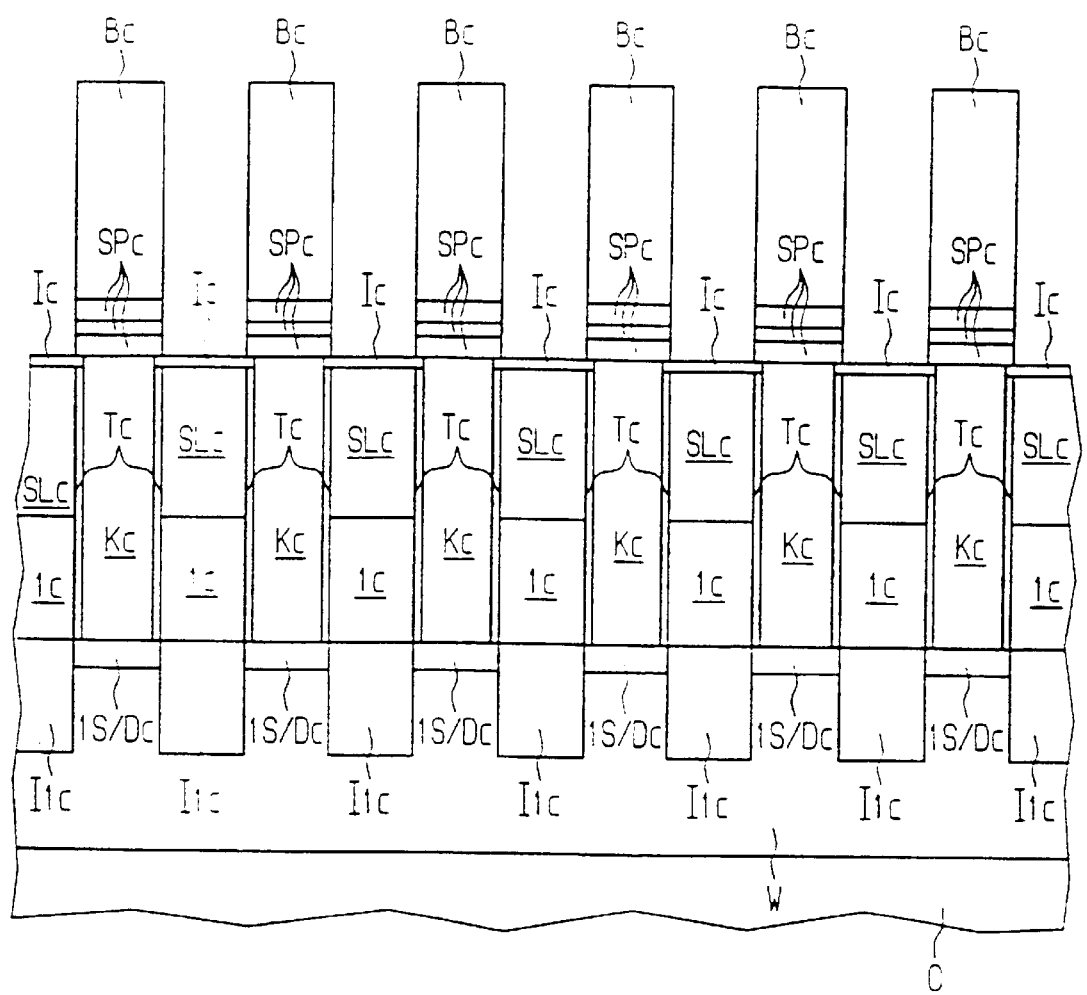

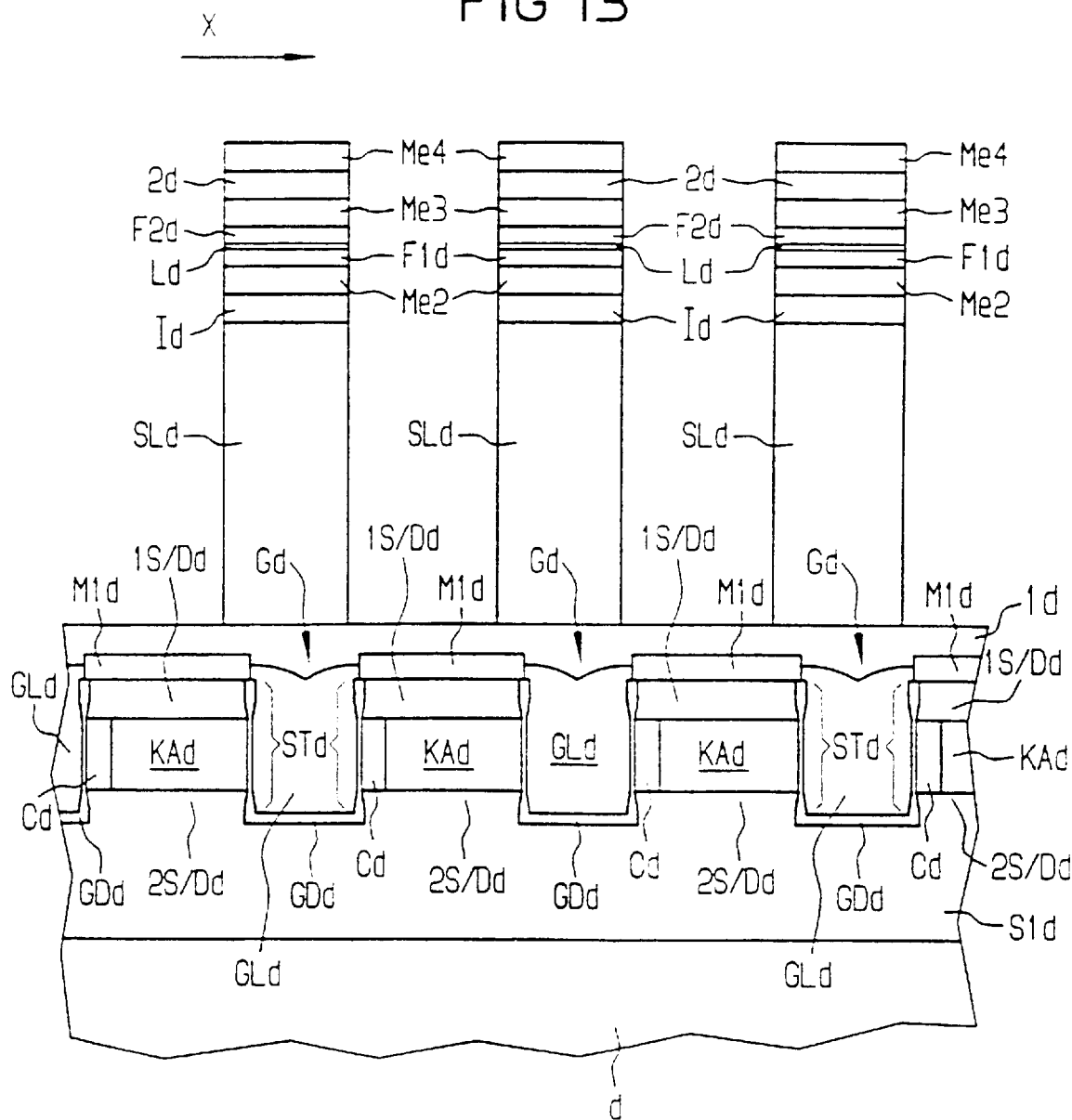

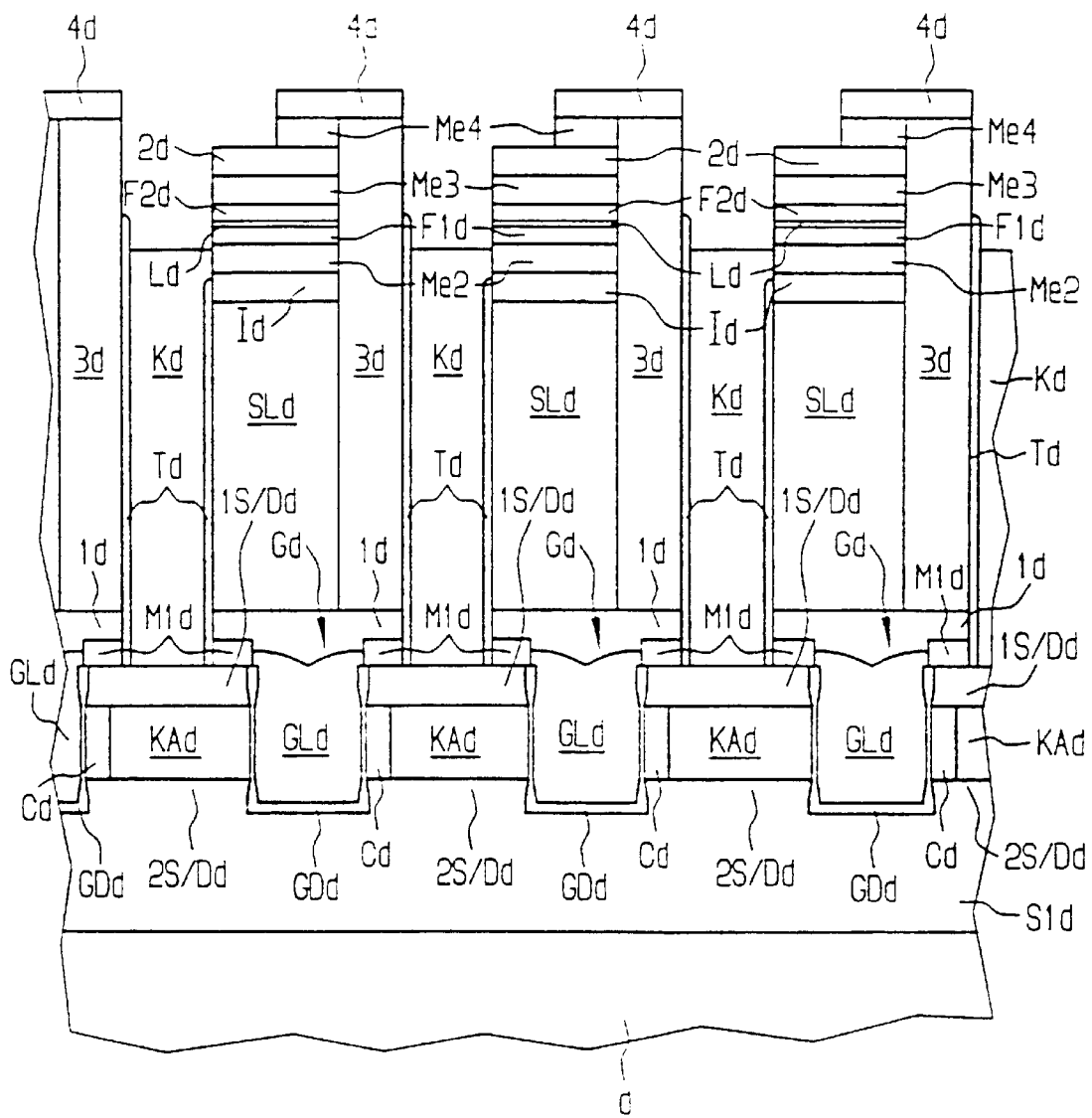

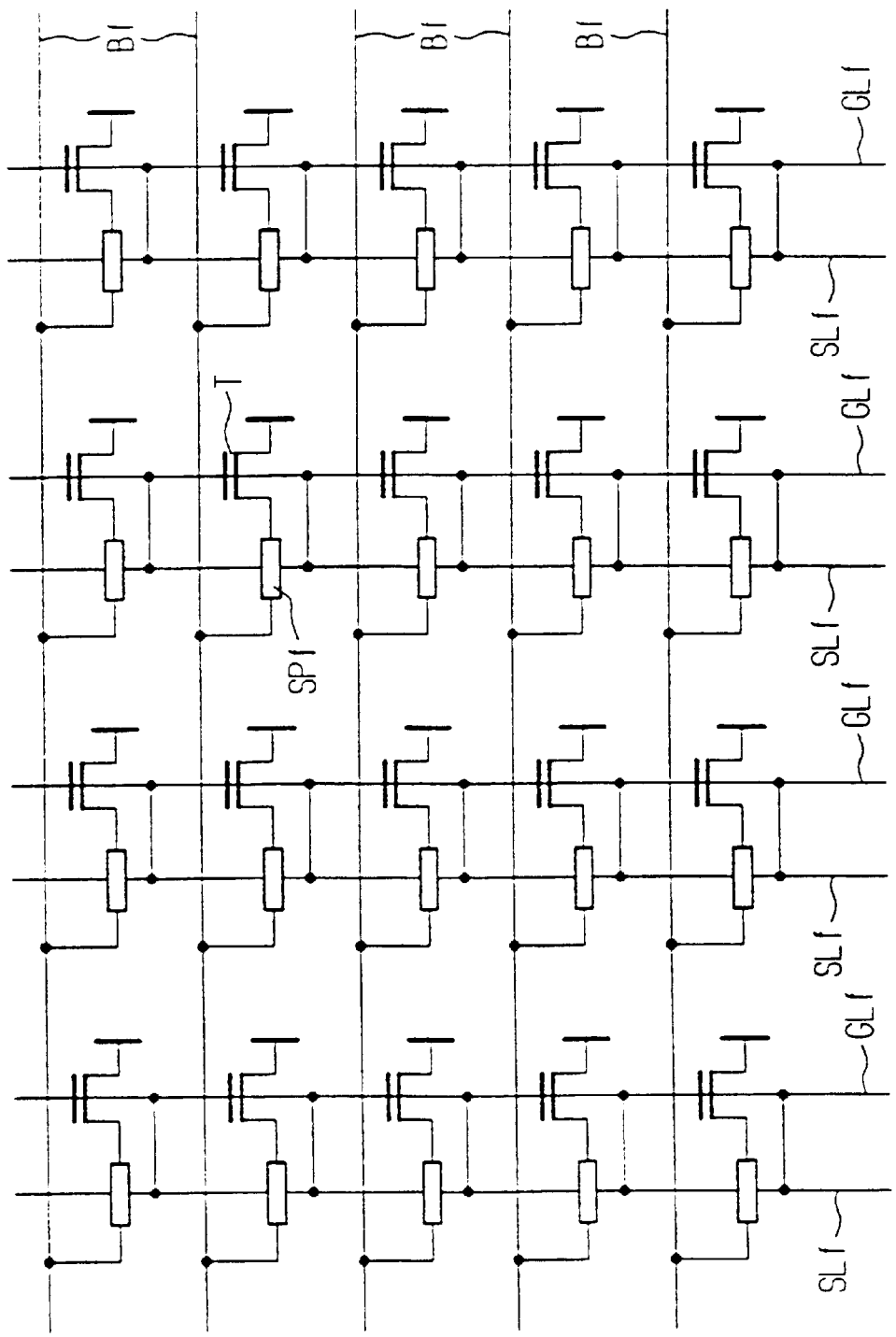

MEMORY CELL CONFIGURATION IN WHICH AN ELECTRICAL RESISTANCE OF A MEMORY ELEMENT REPRESENTS AN INFORMATION ITEM AND CAN BE INFLUENCED BY A MAGNETIC FIELD, AND METHOD FOR FABRICATING IT

CROSS-REFERENCE TO RELATED APPLICATION

This is a continuation of copending International Application PCT/DE99/01958, filed Jul. 1, 1999, which designated the United States.

BACKGROUND OF THE INVENTION

Field of the Invention

The invention relates to a memory cell configuration in which an electrical resistance of a memory element represents an information item and can be influenced by a magnetic field, and a method for fabricating it.

There are elements whose electrical resistances can be influenced by magnetic fields. These include the so-called giant magnetoresistive (GMR) elements, which have at least two ferromagnetic layers and a nonmagnetic layer disposed in between and exhibit the so-called giant magnetoresistive (GMR) effect. The GMR effect is the term used to denote the fact that an electrical resistance of the GMR element is dependent on whether the magnetizations in the two ferromagnetic layers are oriented parallel or antiparallel to one another. A magnetic field can change the magnetization direction of one or both layers and, consequently, the electrical resistance of the GMR element. In the case of a current flow perpendicular to the planes of the layers of the memory element (i.e. current perpendicular to plane (CPP) configuration), the GMR element has a different electrical resistance and magnetoresistance effect than in the case of a current flow parallel to the planes of the layers of the memory element (current in plane (CIP) configuration) (see the reference by F. W. Patten et al., title "Overview of the DARPA Non-Volatile Magnetic Memory Program", IEEE 1996, pages 1–2).

If the nonmagnetic layer is conductive, then the term referred to is spin valve (SV) effect. If the nonmagnetic layer is insulating, then the term referred to is spin tunneling (ST) or tunneling magnetoresistance (TMR) effect (see Patten et al. loc. cit.).

In order to be able to orient the magnetization directions of the two ferromagnetic layers parallel or antiparallel to one another using a field which permeates both layers, the threshold fields, i.e. the smallest fields which are necessary for changing the magnetization directions, are different for the layers. The magnitude of the threshold fields can be influenced by the choice of materials, by the thickness of the layers, by the size and direction of the magnetic field during the deposition of the layers, and by the temperature during the deposition of the layers (see the reference by J. S. Moodera et al., J. Appl. Phys. 79 (8) 1996, pages 4724 to 4729). Another possibility for influencing the threshold field of a ferromagnetic layer is to dispose, adjoining the ferromagnetic layer, an antiferromagnetic layer which virtually fixes the magnetization direction of the ferromagnetic layer and thus effectively increases the threshold field of the ferromagnetic layer.

The reference by D. D. Tang et al., IEDM 95, pages 997 to 999, and the reference by D. D. Tang et al., IEEE Trans. on Magnetics, Vol. 31, No. 6, 1995, pages 3206 to 3208, propose using GMR elements of this type as memory elements in a memory cell configuration. The magnetization direction of a first ferromagnetic layer of a memory element is fixed by an adjacent antiferromagnetic layer. The magnetization direction of a second ferromagnetic layer can be altered by a magnetic field that is larger than the threshold field of the second layer, without altering the magnetization direction of the first layer. In order that each memory element can be programmed separately, write lines are provided, which cross in the region of the memory elements. In order to program the memory cell, the magnetic field is generated by current being sent through the associated two write lines. The current intensities are dimensioned in such a way that only the superposition of the magnetic fields of both write lines suffices to exceed the minimum intensity required to alter the magnetization direction of the second ferromagnetic layer. The memory elements are connected in series. Each row forms a bit line. The write lines are electrically insulated from the bit lines and the memory elements. In order to read the memory cell, i.e. in order to determine the magnetization direction of its second layer, first a read current is sent through the corresponding bit line and the total voltage dropped across the latter is measured. The two write lines then generate a magnetic field that is larger than the threshold field of the second layer. If the direction of the magnetic field corresponds to the original, i.e. the information-representing magnetization direction of the second layer, then the total voltage on the bit line does not change. Otherwise, the magnetic field changes the magnetization direction of the second layer with the consequence that the total voltage changes.

The reference by S. Tehrani et al., IEDM 96, page 193 et seq., proposes using, as a memory element, a GMR element which has ferromagnetic layers of different thicknesses. The magnetic field for writing in information is dimensioned in such a way that it exceeds the minimum strength for changing the magnetization direction of the thicker of the two ferromagnetic layers. For the read-out, i.e. for the determination of the magnetization direction of the thicker layer, a magnetic field is set which magnetizes the thinner but not the thicker of the two layers in a distinguished direction, and the associated voltage on a bit line is measured. Afterward, a magnetic field is set which magnetizes the thinner layer in the opposite direction and the associated voltage on the bit line is measured. The magnetization direction of the thicker layer is obtained from the sign of the difference between the voltages. The magnetization in the thicker of the two ferromagnetic layers remains uninfluenced by the read-out.

The read-out operation by comparing two successively measured voltages requires an increased outlay on circuitry and takes a long time.

U.S. Pat. No. 5,640,343 describes an MRAM cell configuration in which memory elements are disposed in an x-y grid. First lines run perpendicularly to second lines. The memory elements are each connected between one of the first lines and one of the second lines. For each memory element there are a multiplicity of parallel current paths, which make reliable determination of resistance more difficult.

U.S. Pat. No. 5,173,873 describes an MRAM cell configuration in which a memory element has a magnetoresistive layer disposed between two ferromagnetic layers. The magnetization direction of one of the ferromagnetic layers is changed by an external magnetic field. The other of the ferromagnetic layers has a higher coercive force and its magnetization direction is not altered by the magnetic field.

The magnetic field is generated by a line running past the memory element. The sign of the current flow through the line determines whether the information 0 or 1 is written to the memory element. The line is connected to a write line via a transistor that selects the memory element from among other memory elements during writing. In order to write and in order to read out the information, a plurality of transistors and a plurality of lines are provided per memory element, which select the memory element from among other memory elements. This MRAM cell configuration has the disadvantage that because of the many transistors and lines per memory cell, its packing density is low.

SUMMARY OF THE INVENTION:

It is accordingly an object of the invention to provide a memory cell configuration in which an electrical resistance of a memory element represents an information item and can be influenced by a magnetic field, and a method for fabricating it that overcome the above-mentioned disadvantages of the prior art devices and methods of this general type, in which the information item can be read out with a reduced outlay on circuitry or faster.

With the foregoing and other objects in view there is provided, in accordance with the invention, a memory cell configuration containing a memory cell having a memory element and a transistor connected in series with the memory element. The memory element has an electrical resistance representing an information item that can be influenced by a magnetic field. A write line and a bit line running transversely to the write line and electrically connected to the transistor are provided. The bit line and the write line cross in a region of the memory element and both serve for generating the magnetic field. A gate line is connected to and drives the transistor. The gate line runs transversely with respect to the bit line, and through which the information item can be read out.

The memory cell configuration according to the invention contains the memory cells which each include a memory element, whose electrical resistance represents an information item that can be influenced by a magnetic field, and the single transistor. The transistor allows a selection of the associated memory cell from among the memory cells during the read-out of the information.

Since the transistors enable the selection of the memory cell, it is not necessary to measure two voltages for the purpose of determining the resistance of the memory cell to be read. The other memory cells have no influence on the voltage. This reduces both the reading duration and the outlay on circuitry. The reliability of the resistance measurement is also not adversely affected by large cell arrays.

The memory cells are connected to bit lines. Memory cells adjacent to one another along one of the bit lines are not connected in series with one another. In order to read one of the memory cells, the associated transistor is driven via the gate line running transversely with respect to the bit line, and the resistance of the memory element is determined from the current or the voltage of the associated bit line. Since the memory cells are not connected in series as part of the bit line, only the memory cell to be read influences the current or the voltage of the associated bit line. The remaining memory cells have no influence on the current or the voltage.

In the prior art, the memory cells are often connected in series. The current to be measured does not flow only through the memory cell to be read, for which reason it is reduced by other memory cells. On account of the reduction of the current, a sense amplifier already has to be provided for a small number of series-connected memory cells, which results in a large area requirement.

One advantage of the interconnection proposed in the context of the invention is that the current does not flow through other memory cells and, therefore, is not reduced unnecessarily. Moreover, a particularly high packing density of the memory cell configuration can be achieved since fewer sense amplifiers are required.

Write lines that run transversely with respect to the bit lines and cross the bit lines in regions of the memory elements are provided for the circuit configuration according to the invention. The memory elements can be disposed below, above or between the mutually crossing write lines and bit lines. In order to program a memory cell, a current is sent through the associated write line and a current is sent through the associated bit line. In this case, the currents generate a magnetic field that is stronger in the memory cell than in the remaining memory cells. To ensure that the magnetic field in the memory cell is as large as possible, it is advantageous if the bit line and the write line are disposed as near as possible to the memory element.

A memory cell to be programmed can be selected from among the other memory cells by the mutually crossing write lines and bit lines. In contrast to U.S. Pat. No. 5,173,873, the memory cell does not require a transistor for selection during writing, so that a higher packing density can be realized.

In order to simplify the process and in order to increase the packing density, it is advantageous if gate electrodes of the transistors are parts of the gate lines.

The transistor may be e.g. of a planar configuration. This affords the advantage that it is possible to employ the standard technology for fabricating the transistor. In order to increase the packing density, it is furthermore advantageous if the transistors of adjacent memory cells along the bit line have, in pairs, a common source/drain region.

In order to increase the packing density of the memory cell configuration, the transistor may have a vertical configuration.

The memory cells may be connected to a common voltage terminal. During the reading of the memory cell, the current flows between the voltage terminal and the bit line through the memory cell.

As an alternative, the memory cells may be connected to the write lines in such a way that, during read-out, the current flows between the associated write line and the associated bit line through the memory cell to be read.

In order to reduce the number of lines and, consequently, increase the packing density, it is advantageous if the write line and the gate line coincide. This is possible in particular when the memory cells are connected to the common voltage terminal. Since, in the standard technology, the gate electrodes are produced immediately after the production of gate dielectrics, it is advantageous, for the case where the gate electrodes are parts of the gate lines, if the gate lines are produced first and, in a later process step, the write lines are produced in a manner adjoining the gate lines. In this case, different materials can be used for the write line and for the gate line. As an alternative, the write line and the gate line are produced as a common line in one step.

In order to filter out background noise that is similar for adjacent bit lines, it is advantageous to provide the memory cell configuration with folded bit lines. In the case of folded bit lines, during the reading of the memory cell, the difference between currents or voltages of the corresponding bit line and an adjacent bit line is formed. To ensure that the current or the voltage of the adjacent bit line only represents background noise, it is necessary that the gate line associated with the memory cell not be electrically connected to any memory cell that is electrically connected to the adjacent bit line.

In order to simplify the process, it is advantageous to provide no folded bit lines. The term then referred to is open bit lines.

If the transistor is a vertical transistor, it is possible to produce a semiconductor structure in which a first source/drain region of the transistor is disposed above a channel region. A second source/drain region of the transistor can be disposed below the channel region or offset diagonally downward with respect to the channel region. The gate line is disposed at least on a first side wall of the semiconductor structure.

In order to increase the packing density, it is advantageous if a gate line adjacent to the gate line is disposed on a second sidewall, opposite the first sidewall. In this case, in the region of the channel region, an element which prevents the formation of a channel adjoins the second side wall. This prevents the adjacent gate line from controlling the transistor.

As an alternative, the gate line can be disposed e.g. either on the first sidewall or on the second sidewall.

In order to increase the packing density, the element that prevents the formation of a channel may be e.g. a channel stop region. The channel stop region is doped by the same conductivity type as the channel region but has a higher dopant concentration. The channel stop region may be produced e.g. by inclined implantation or by outdiffusion of dopant from a material.

In order to increase the packing density, the element which prevents the formation of a channel may e.g. also be produced in the form of a preferably spacer-type insulating structure.

In order to produce the semiconductor structure, trenches can be produced in a substrate or in layers disposed above the substrate, as a result of which the semiconductor structure is produced in the form of a strip. The gate lines are produced in the trenches. The semiconductor structure is part of memory cells that are adjacent to one another along the gate line. To ensure that the gate line does not produce any channels between first source/drain regions of the semiconductor structure, further elements that prevent the formation of channels can be disposed between adjacent first source/drain regions.

As an alternative, a semiconductor structure is produced for each memory cell by a lattice-type depression in the form of first trenches and second trenches running transversely with respect to the first trenches being produced in the substrate or in layers disposed above the substrate. As a result of which the semiconductor structure is produced in the form of a parallelepiped. The gate lines are produced in the lattice-type depression, e.g. in and along the first trenches. Between adjacent semiconductor structures along the gate line, insulating structures that prevent the formation of channels can be produced in the lattice-type depression, e.g. in the second trenches.

It is likewise possible also to disposed the gate line in the lattice-type depression between the adjacent semiconductor structures along the gate line. In this case, the gate line surrounds the semiconductor structure in an annular manner. This configuration is advantageous for enlarging the channel width and thus for increasing the current intensity through the transistor. To ensure that semiconductor structures that are adjacent transversely with respect to the gate line can be driven by different gate lines, mutually adjacent gate lines share one of the first trenches. In order to increase the packing density, it is advantageous if parts of the gate lines which are disposed in the first trenches are in spacer form.

If the gate line is only disposed on the first side wall of the semiconductor structure and folded bit lines are provided, then it is advantageous, in order to increase the packing density, if mutually adjacent gate lines are disposed together in one of the trenches. In this case, the elements that prevent the formation of channels alternately adjoin a first sidewall and a second sidewall of the trenches in which the gate lines are disposed. In order to increase the packing density, it is particularly advantageous if the gate lines are in spacer form. If no folded bit lines are provided, it is advantageous, in order to simplify the process, if the gate line fills the trench.

Any element whose electrical resistance can be influenced by a magnetic field is suitable as the memory element. The so-called Lorentz force acts on moving electrons traversing a magnetic field, the force acting perpendicularly to the direction of motion. A layer made of a material in the case of which the Lorentz force causes the electrons to be displaced to one side of the layer can be used as the memory element. In comparison with the electrical resistance of the layer in the absence of a magnetic field, the magnetic field brings about an effective reduction of the layer cross-section perpendicular to the current flow and, accordingly, an increase in the electrical resistance.

A layer made of a material that exhibits the so-called anisotropic magnetoresistance effect may be provided as the memory element. This effect is a property of the material and causes the size of the electrical resistance to depend on whether the magnetic field is present perpendicularly or parallel to the current flow.

It lies within the scope of the invention for the memory element to be a GMR element. It is also possible to use TMR elements.

By way of example, the memory element includes a first magnetic layer, which requires a first threshold field for changing its magnetization direction, and a second magnetic layer, which requires a second threshold field for changing its magnetization direction, the two magnetic layers being separated from one another by a nonmagnetic layer. The nonmagnetic layer may be e.g. a dielectric or conductive. Alternative possibilities for the configuration of the memory element, such as e.g. the configuration of an antiferromagnetic layer for fixing the magnetization direction of one of the magnetic layers, can be found e.g. in the prior art presented in the introductory part of this description. The magnetic layers are ferromagnetic, for example.

The current flow through the memory element may run perpendicularly (CPP configuration) or parallel (CIP configuration) to the planes of the layers of the memory element.

To ensure that the magnetic field that is generated for the purpose of programming does not have to homogeneously permeate the entire memory element, it is advantageous if the dimensions of the magnetic layers are such that each layer includes only one magnetic domain in each case. The magnetization direction is essentially homogeneous within a domain. If the magnetic field permeates most of the layer, then the magnetization direction of the entire domain and thus of the entire layer changes. A further advantage is that the resistance of such a memory element assumes welldefined values. By contrast, if the layer includes a plurality of domains, then the resistance may vary on account of different magnetization directions of the domains. The switching speed of the memory element whose magnetic layers includes only one domain in each case is also greater since the magnetization direction changes as a result of rotation of the magnetization. In the case of a memory element whose magnetic layers include a plurality of domains in each case, the magnetization direction changes both as a result of rotation of the magnetization and as a result of shifting of domain walls.

Suitable materials for the magnetic layers are e.g. Ni, Fe, Co, Cr, Mn, Gd, Dy and alloys thereof, such as NiFe, NiFeCo, CoFe, CoCrFe, and also MuBi, BiFe, CoSm, CoPt, CoMnB, CoFeB. Suitable insulating materials for the non-magnetic layer are e.g. $Al_2O_3$, MgO, NiO, $HfO_2$, $TiO_2$, NbO, $SiO_2$ and DLC (diamond-like carbon). Suitable conductive materials for the nonmagnetic layer are e.g. Cu or Ag.

In order to obtain a sufficiently large threshold field, a material having a high coercive force can be used for the relevant magnetic layer. Deposition of the material in a magnetic field or heat treatment of the deposited material in a magnetic field can likewise bring about a particularly large threshold field.

Preferred magnetization directions can be produced by depositing or heat-treating the magnetic layers in the magnetic field. These methods are based on physical effects, such as crystal anisotropy and uniaxial anisotropy.

The memory element may have more than two magnetic layers that are disposed one above the other and are separated from one another by nonmagnetic layers.

The memory element may be disposed next to the transistor. In order to increase the packing density, it is advantageous if the memory element is disposed above or below the transistor.

If the memory element is disposed above the transistor, a contact may be disposed on the first source/drain region. The write line may be disposed next to the contact, an insulation being disposed on the line. The memory element is produced above the insulation and above and adjoining the contact. The bit line may be produced above the memory element.

It is advantageous if the insulation on the write line is as thin as possible in order that the influence of the write line on the memory element, i.e. the magnetic field generated by the write line at the location of the memory element, is as large as possible. In order to produce the insulation, the contact, in contrast to the write line, can be produced from a hard conductive material. After the production of the contact and the write line, whose upper areas are, for example, initially at the same level, the write line is removed somewhat by chemical mechanical polishing until the contact protrudes somewhat on account of the hardness of the material. The upper areas of the write line and of the contact are now at different levels. In order to produce the insulation, insulating material is deposited and planarized by chemical mechanical polishing until the upper area of the contact is uncovered. The thickness of the insulation depends on the difference between the levels of the upper areas of the write line and of the contact, i.e. it depends on how far the contact projected.

Since the contact adjoins the memory element and the write line should be disposed as close as possible to the memory element, it is advantageous, in order to increase the packing density, if the contact and the write line are disposed as close together as possible. To that end, after the production of the transistor, an insulating layer may be produced, in which the contact is produced. With the aid of a strip-type mask that partly overlaps the contact, the insulating layer is etched selectively with respect to the contact. Afterward, conductive material is deposited and etched back or planarized, as a result of which the write line is produced.

In order to electrically insulate the write line from the contact, it is possible, before the write line is produced, to produce an isolating layer at least on the uncovered areas of the contact. As an alternative, in order to produce the contact, first a contact hole is produced, whose side areas are provided with the isolating layer and which is subsequently filled with the conductive material. The isolating layer is etched selectively with respect to the insulating layer during the production of the write line. This also applies analogously to the bit line if the bit line is disposed below the memory element.

If the intention is for the gate line to coincide with the write line, during the production of the write line, the insulating layer is cut through until the gate line is uncovered.

The contact can also make contact with the memory element from the side instead of from below. This is particularly advantageous for the case where the current flow through the memory element runs parallel to the planes of its layers. If the current flow runs vertically with respect to the planes of the layers of the memory element, then it is possible, if the contact is produced after the memory element, first to produce a contact hole adjoining the memory element. The isolating layer is produced on side areas of the contact hole by deposition and etching-back, the isolating layer extending to a point below the first magnetic layer of the memory element. The contact hole is filled by the deposition of the conductive material. The conductive material is subsequently etched back until a contact is produced, the upper area of which is level with the first magnetic layer. The second magnetic layer is contact-connected by the bit line.

The memory cell configuration can be used, in particular, as an MRAM memory cell configuration.

One possible method of operation is explained below.

In order to program a memory cell, current is sent through the associated write line and through the associated bit line. Depending on the direction of the currents, the magnetization direction of the magnetically softer of the two magnetic layers is set parallel or antiparallel to the magnetization direction of the magnetically harder of the two magnetic layers, whose magnetization direction is not altered.

For read-out, the transistor is driven via the associated gate line and a current is sent through the memory cell, which current is read out on the bit line. The current through or the voltage drop across the memory cell depends on the electrical resistance of the memory element, which in turn depends on the magnetization direction of the softer of the two magnetic layers.

Other features which are considered as characteristic for the invention are set forth in the appended claims.

Although the invention is illustrated and described herein as embodied in a memory cell configuration in which an electrical resistance of a memory element represents an information item and can be influenced by a magnetic field, and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1a is a diagrammatic, cross-sectional view through a first substrate after a first layer, a second layer, strip-type doped regions and a first mask have been produced according to the invention;

FIG. 1b is a cross-sectional view through the first substrate that is perpendicular to the cross section of FIG. 1a, after the process steps from FIG. 1a;

FIG. 2 is a cross-sectional view of FIG. 1a after trenches, semiconductor structures, first source/drain regions, channel regions, second source/drain regions and channel stop regions have been produced;

FIG. 3b is a cross-sectional view of FIG. 1b after the process steps from FIG. 3a;

FIG. 3c is show a plan view of the first substrate illustrating the trenches, contacts and a second mask;

FIG. 4b is a cross-sectional view of FIG. 3b after the process steps from FIG. 4a;

FIG. 4c is a circuit diagram of a first MRAM cell configuration;

FIG. 5a is a cross-sectional view through a second substrate after a first layer, a second layer, a third layer and a first mask have been produced;

FIG. 5b is a cross-sectional view through the second substrate which is perpendicular to the cross section from FIG. 5a, after the process steps from FIG. 5a;

FIG. 6b is a cross-sectional view of FIG. 5b after the process steps from FIG. 6a;

FIG. 7b is a cross-sectional view of FIG. 6b after the process steps from FIG. 7a;

FIG. 8b is a cross-sectional view of FIG. 7b after the process steps from FIG. 8a;

FIG. 9 is plan view of a third substrate after an insulating structure has been produced;

FIG. 10 is a cross-sectional view through the third substrate after the first insulating structure, first source/drain regions, second source/drain regions, channel regions, gate lines and etching stop structures have been produced;

FIG. 11a is a cross-sectional view of FIG. 10 after a first insulating layer, isolating layers, contacts and write lines have been produced;

FIG. 11b is a cross-sectional view through the third substrate which is perpendicular to the cross section from FIG. 11a, after the process steps from FIG. 11a;

FIG. 12b is a cross-sectional view of FIG. 11b after the process steps from FIG. 12a;

FIG. 13 is a cross-sectional view through a fourth substrate after a first mask, trenches, semiconductor structures, first source/drain regions, channel regions, second source/drain regions, channel stop regions, a gate dielectric, gate lines, a first insulating layer, write lines, an insulation, a second metal layer, a first magnetic layer, a dielectric, a second magnetic layer, a third metal layer, a second insulating layer and a fourth metal layer have been produced;

FIG. 15 is a cross-sectional view of FIG. 14 after contacts have been produced;

FIG. 16b is a cross-sectional view through the fourth substrate which is perpendicular to the cross section from FIG. 16a, after the process steps from FIG. 16a;

DESCRIPTION OF THE PREFERRED EMBODIMENTS

Figure 3A:
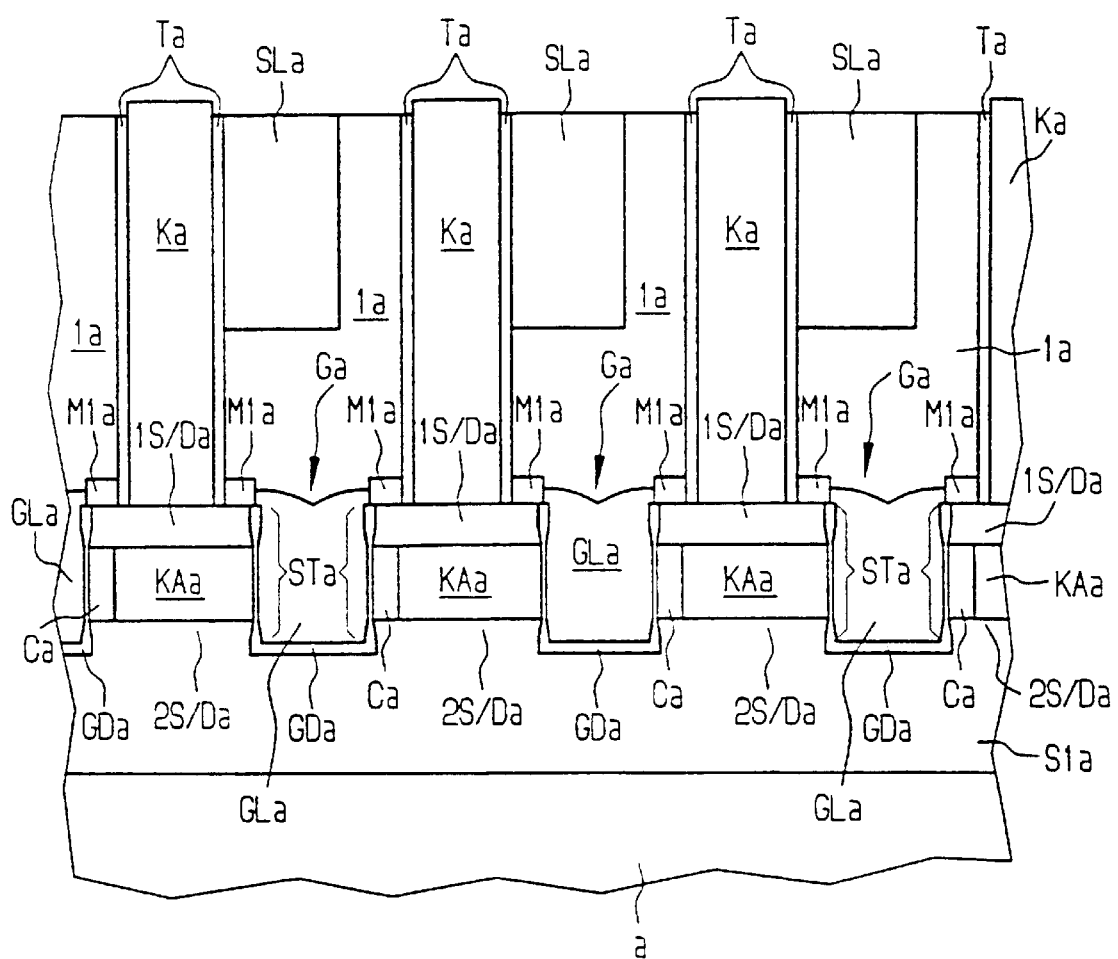
FIG. 3a is a cross-sectional view of FIG. 2 after a gate dielectric, gate lines, a first insulating layer, isolating layers, contacts and write lines have been produced.

In all the figures of the drawing, sub-features and integral parts that correspond to one another bear the same reference symbol in each case. Referring now to the figures of the drawing in detail and first, particularly, to FIG. 1a thereof, there is shown a first exemplary embodiment of a memory cell. The first embodiment has a first substrate "a" which is a silicon wafer that is p-doped and has a dopant concentration of approximately $10^{15}$ cm$^{-3}$. By an in-situ-doped epitaxy, an n-doped first layer S1a is produced on the substrate which has a thickness of approximately 500 nm and has a dopant concentration of approximately $5*10^{20}$ cm$^{-3}$. Above the layer S1$a$, by an in-situ-doped epitaxy, a p-doped second layer S2$a$ is produced which has a thickness of approximately 450 nm and has a dopant concentration of approximately $3*10^{17}$ cm$^{-3}$ (see FIGS. 1$a$ and 1$b$).

With the aid of a non-illustrated first photoresist mask whose strips are approximately 500 nm wide and have a spacing of approximately 500 nm from one another and run parallel to an x-axis X, n-doped strip-type regions GE having a thickness of approximately 100 nm are produced by implantation (see FIG. 1$b$). The dopant concentration of the strip-type doped regions GE is approximately $5 \times 10^{20}$ cm$^{-3}$. The dopant thereof is activated by a heat-treatment step. The x-axis X runs parallel to a surface Oa of the first substrate a.

In order to produce a first mask M1$a$, using a TEOS method, SiO$_2$ is deposited to a thickness of approximately 100 nm and patterned in strip form using a photolithographic method. The strips of the first mask M1$a$ run parallel to a y-axis Y, which runs perpendicularly to the x-axis X and parallel to the surface Oa. The strips of the first mask M1$a$ are approximately 750 nm wide and have a spacing of approximately 500 nm from one another (see FIGS. 1$a$ and 1$b$).

With the aid of the first mask M1$a$, silicon is etched to a depth of approximately 600 nm using e.g. HBr+NF$_3$+He+O$_2$, as a result of which trenches Ga are produced (FIG. 2). The trenches Ga cut through the strip-type doped regions GE and the second layer S2$a$ and reach down into the first layer S1$a$. Strip-type semiconductor structures STa are produced between the trenches Ga. As parts of the semiconductor structures STa, first source/drain regions 1S/Da of vertical transistors are produced from the strip-type regions GE. Parts of the second layer S2$a$ that are disposed underneath the first source/drain regions 1S/Da are suitable as channel regions KAa. Parts of the first layer S1$a$ that are disposed underneath the channel regions KAa are suitable as second source/drain regions 2S/Da. The second source/drain regions 2S/Da of the transistors are thus electrically connected to one another. They are connected to a voltage terminal.

By an inclined implantation with the aid of p-doping ions, channel stop regions Ca are produced in the region of the channel regions KAa and adjoining first side walls of the trenches Ga. A dimension of the channel stop regions Ca which is parallel to the x-axis X is approximately 100 nm. The dopant concentration of the channel stop regions Ca is approximately $10^{19}$ cm$^{-3}$.

A gate dielectric GDa having a thickness of approximately 10 nm is produced by thermal oxidation (see FIG. 3$a$). In order to produce gate lines GLa, in-situ n-doped polysilicon is deposited to a thickness of approximately 150 nm and etched back approximately 200 nm using e.g. C$_2$F$_6$+O$_2$. This produces the gate lines GLa, which fill the trenches Ga. Parts of the gate lines GLa which are disposed in the region of the channel regions KAa are suitable as gate electrodes of the transistors.

A first insulating layer 1$a$ is produced by the deposition of SiO$_2$ to a thickness of approximately 1500 nm and by chemical mechanical polishing down to a thickness of approximately 1000 nm (see FIGS. 3$a$ and 3$b$).

In order to produce contacts Ka, contact holes are etched in the first insulating layer 1$a$ by a photolithographic method until the first source/drain regions 1S/Da are uncovered. A suitable etchant is e.g. CHF$_3$+O$_2$, CHF$_3$+CF$_4$, C$_4$F$_8$+CO. In order to produce an isolating layer Ta on side areas of the contact holes, silicon nitride is deposited to a thickness of approximately 50 nm and etched back, as a result of which the isolating layer Ta is produced in the form of spacers. A suitable etchant is e.g. CHF$_3$+O$_2$.

The contacts Ka are produced in the contact holes by the deposition of tungsten to a thickness of approximately 500 nm and etching-back. A suitable etchant is e.g. SF$_6$+H$_2$+O$_2$ (see FIGS. 3$a$ and 3$b$).

A strip-type second mask M2$a$ is produced from photoresist (see FIG. 3$c$). The strips of the second mask M2$a$ are approximately 500 nm wide, have a spacing of approximately 750 nm from one another, run parallel to the y-axis Y and partly overlap the contacts Ka. With the aid of the second mask M2$a$, SiO$_2$ is etched selectively with respect to tungsten and silicon nitride to a depth of approximately 500 nm. A suitable etchant is e.g. C$_2$F$_6$+O$_2$.

The isolating layer Ta is partly uncovered in the process. After the removal of the second mask M2$a$, copper is deposited to a thickness of approximately 1 $\mu$m. By a chemical mechanical polishing process, copper and part of the first insulating layer 1$a$ are removed until the contacts Ka project approximately 50 nm on account of the greater hardness of tungsten (see FIGS. 3$a$ and 3$b$). Write lines SLa are produced from the copper.

Figure 4A:
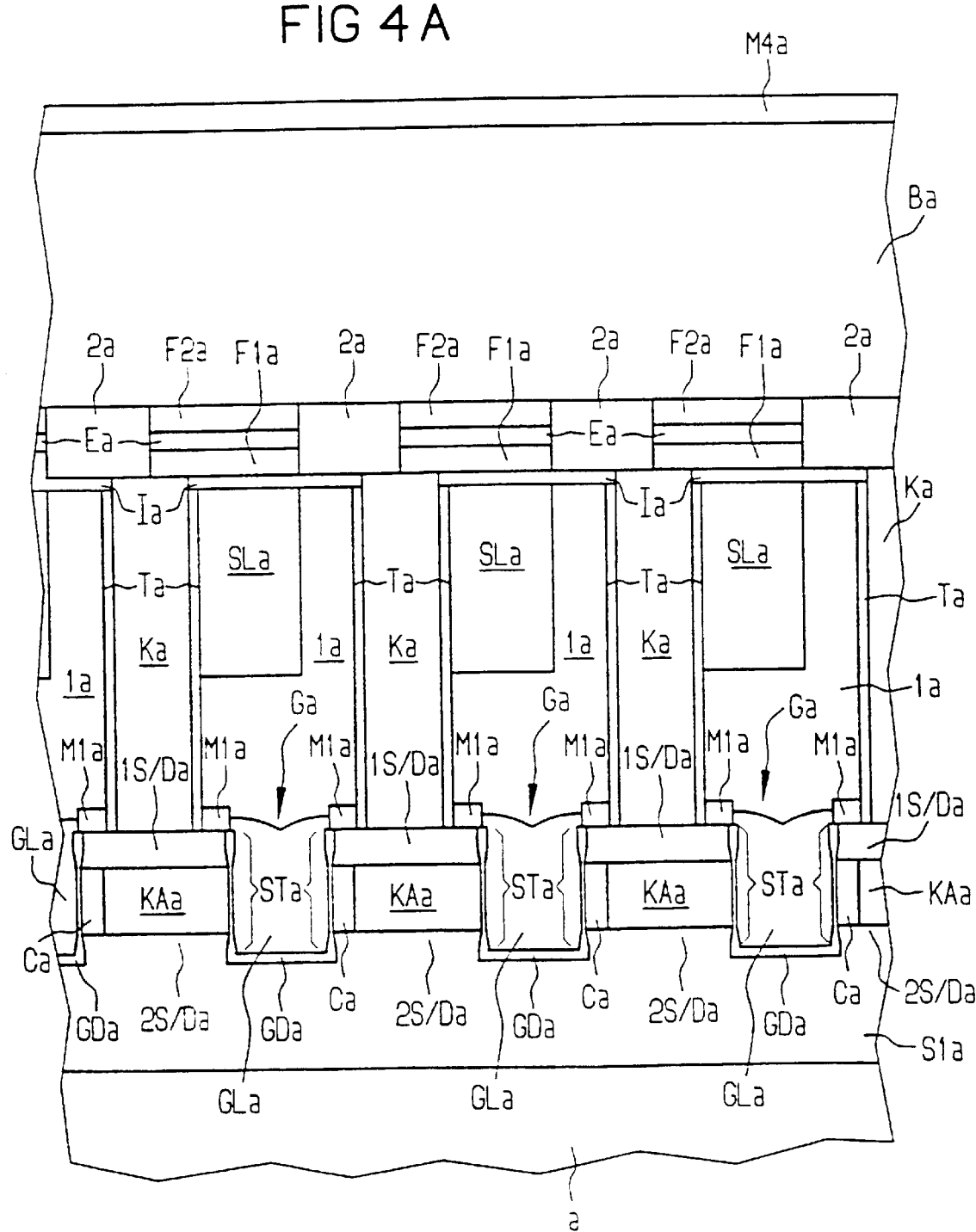
FIG. 4a is a cross-sectional view of FIG. 3a after an insulation, a first magnetic layer, a nonmagnetic layer, a second magnetic layer, a second insulating layer, bit lines and a fourth mask have been produced.
Figure 4B:
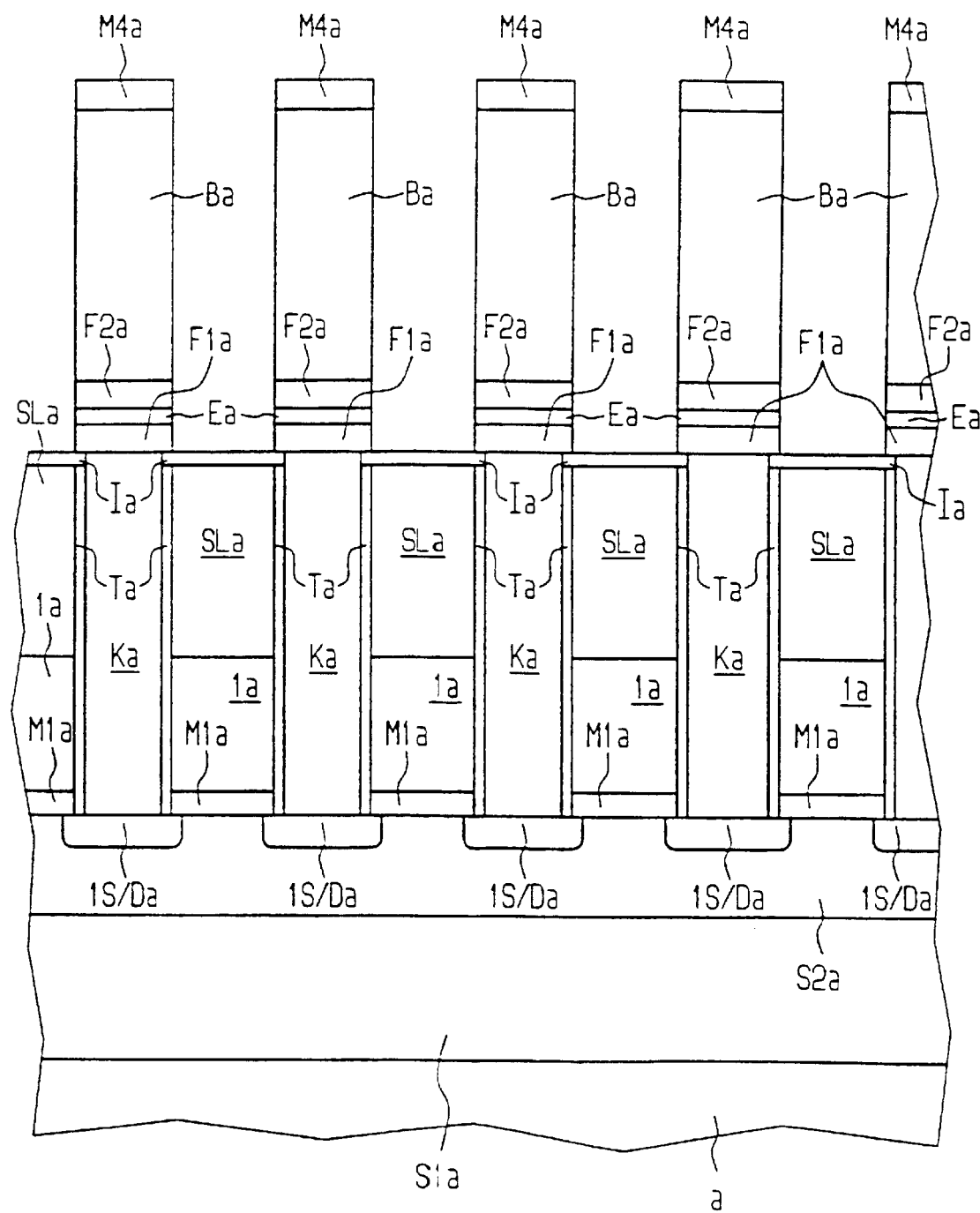

In order to produce an insulation I$a$ (FIG. 4$a$), SiO$_2$ is deposited to a thickness of approximately 100 nm and removed by chemical mechanical polishing until an upper area of the contacts Ka is uncovered. As a result, the insulation I$a$ having a thickness of approximately 50 nm is produced above the write lines SLa.

In order to produce a first magnetic layer F1$a$, Co is deposited to a thickness of approximately 10 nm. Above that, in order to produce a dielectric Ea, Al$_2$O$_3$ is produced by aluminum being applied to a thickness of approximately 3 nm and being oxidized in a plasma. In order to produce a second magnetic layer F2$a$, NiFe is deposited to a thickness of 10 nm.

With the aid of a third mask made of photoresist, this mask being analogous to the second mask M2$a$, the second magnetic layer F2$a$, the dielectric Ea and the first magnetic layer F1$a$ are etched. This can be done e.g. by sputtering using Ar (see FIG. 4$a$). In order to produce a second insulating layer 2$a$, SiO$_2$ is deposited to a thickness of approximately 100 nm and planarized by chemical mechanical polishing until the second magnetic layer F2$a$ is uncovered.

In order to produce bit lines Ba, copper is deposited to a thickness of approximately 500 nm. In order to produce a fourth mask M4$a$, SiO$_2$ is deposited to a thickness of approximately 50 nm and patterned in strip form by a photolithographic method. The strips of the fourth mask M4$a$ are approximately 500 nm wide, have a spacing of approximately 500 nm from one another, cover the contacts Ka and run parallel to the x-axis X. With the aid of the fourth mask M4$a$, copper is etched using e.g. BCl$_3$+Cl$_2$+CH$_4$, as a result of which the bit lines Ba are produced. The second magnetic layer F2$a$, the dielectric Ea and the first magnetic layer F1$a$ are subsequently cut through (see FIGS. 4$a$ and 4$b$). In the process, memory elements are produced above the write lines SLa, the memory elements each containing part of the first magnetic layer F1$a$, of the dielectric Ea and of the second magnetic layer F2$a$.

A first MRAM cell configuration is produced by the method described. A memory cell includes one of the memory elements and one of the vertical transistors (see FIG. 4c). The memory element and the transistor are connected in series. The memory cell is connected between the bit line Ba, which is connected to the second magnetic layer F2a, and the voltage terminal (ground) (see FIG. 4c). In order to program the memory cell, a current is sent in each case through the write line SLa, which traverses the memory cell, and through the bit line Ba. In this case, a magnetic field is generated which, in the memory element, exceeds a threshold field of the associated part of the second magnetic layer F2a, as a result of which its magnetization is oriented in accordance with the magnetic field. The magnetic field is smaller than the threshold field of the associated part of the first magnetic layer F1a, which is harder than the second magnetic layer F2a, for which reason its magnetization direction is preserved. Since the magnetic field is a superposition of a magnetic field of the write line SLa and a magnetic field of the bit line Ba, and no currents flow through the remaining bit lines Ba and write lines SLa, the magnetic field in the memory element is the largest in comparison with the remaining memory elements. In the remaining memory elements, the magnetic field is smaller than the threshold field of the second magnetic layer F2a, for which reason the remaining memory cells are not programmed.

In order to read the memory cell, the transistor is driven via the gate line GLa connected to it. The current which flows between the bit line Ba and the voltage terminal is measured. As an alternative, the voltage drop between the bit line Ba and the voltage terminal is measured. The current or the voltage is dependent on the electrical resistance of the memory element. From the current or the voltage, it is therefore possible to determine the magnetization direction of the associated part of the second magnetic layer F2a and thus the information of the memory cell.

In a second exemplary embodiment, a second substrate b is a p-doped silicon wafer whose dopant concentration is approximately $10^{17}$ cm$^{-3}$ (FIG. 5a). By an in-situ-doped epitaxy, an n-doped first layer S1b is produced which has a thickness of approximately 500 nm and whose dopant concentration is approximately $5*10^{20}$ cm$^{-3}$. Above the first layer S1b, by an in-situ-doped epitaxy, a p-doped second layer S2b is produced which has a thickness of approximately 350 nm and whose dopant concentration is approximately $3*10^{17}$ cm$^{-3}$. Above this layer, by an in-situ-doped epitaxy, an n-doped third layer S3b is produced which has a thickness of approximately 100 nm and whose dopant concentration is approximately $5*10^{20}$ cm$^{-3}$ (see FIGS. 5a and 5b).

In order to produce a first mask M1b, using a TEOS method, SiO$_2$ is deposited to a thickness of approximately 100 nm and patterned in strip form by a photolithographic method using a first photoresist mask (not illustrated). The strips have a width of approximately 500 nm and a spacing of approximately 500 nm from one another and run parallel to a y-axis Y. Through the deposition of SiO$_2$ to a thickness of approximately 150 nm and etching-back, spacers are produced on sidewalls of the strips, as a result of which the strips are widened. The width of the widened strips is approximately 750 nm. A suitable etchant is e.g. CHF$_3$+O$_2$. With the aid of a strip-type second photoresist mask (not illustrated), whose strips run parallel to an x-axis X, which runs perpendicularly to the y-axis Y and parallel to a surface Ob of the second substrate b, and have a width of approximately 500 nm and a spacing of approximately 500 nm from one another, SiO$_2$ is etched, as a result of which the first mask M1b is produced from the widened strips (see FIGS. 5a and 5b).

Figure 6A:
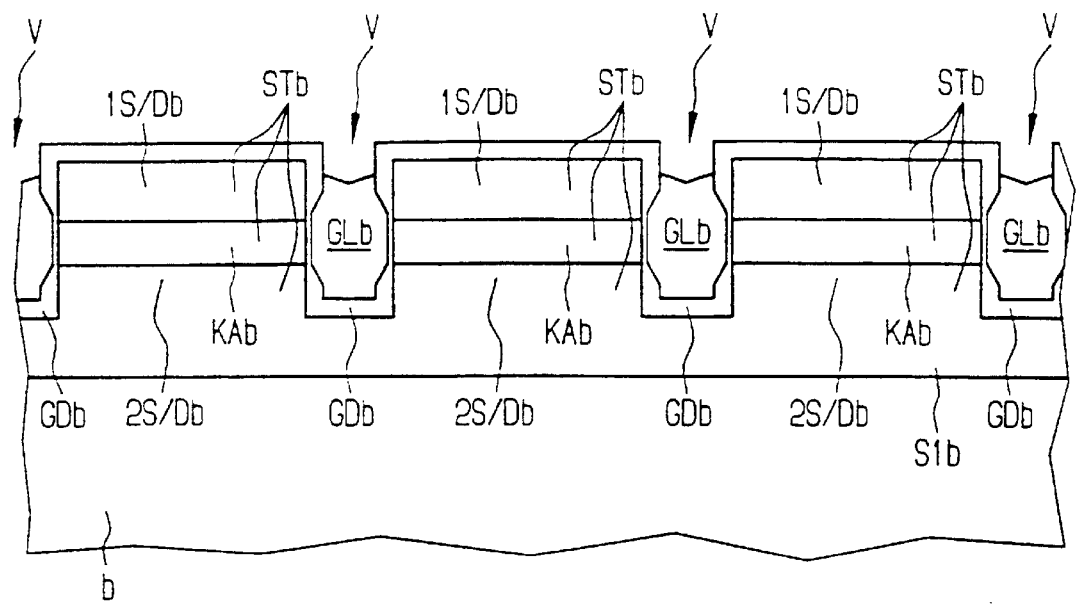
FIG. 6a is a cross-sectional view of FIG. 5a after a lattice-type depression, semiconductor structures, a gate dielectric, first source/drain regions, channel regions, second source/drain regions and gate lines have been produced.
Figure 6B:
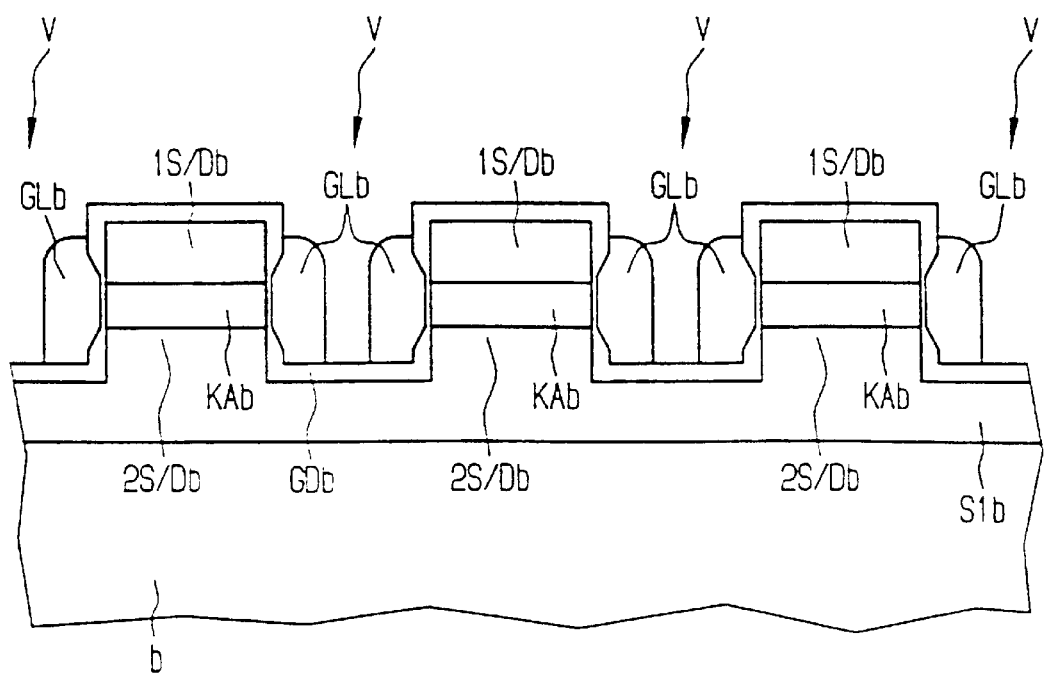

With the aid of the first mask M1b, silicon is etched to a depth of approximately 600 nm using e.g. HBr+NF$_3$+He+O$_2$, as a result of which a lattice-type depression V is produced (FIG. 6a). The third layer S3b and the second layer S2b are cut through in the process. Parallelepipidal semiconductor structures STb are produced. As parts of the semiconductor structures STb, first source/drain regions 1S/Db of vertical transistors are produced from the third layer S3b and channel regions KAb of the transistors are produced from the second layer S2b. Parts of the first layer S1b which are disposed under the channel regions KAb are suitable as second source/drain regions 2S/Db of the transistors. The second source/drain regions 2S/Db are electrically connected to one another (see FIGS. 6a and 6b). They are electrically connected to a voltage terminal.

The first mask M1b is removed by etching SiO$_2$ using e.g. CHF$_3$+O$_2$.

A gate dielectric GDb having a thickness of approximately 5 nm is produced by a thermal oxidation.

Through the deposition of in-situ-doped polysilicon to a thickness of approximately 150 nm and etching-back, gate lines GLb running parallel to the x-axis X are produced in the lattice-type depression V in a self-aligned manner, i.e. without the use of masks to be aligned. The gate lines surrounding the semiconductor structures STb in an annular manner (see FIGS. 6a and 6b). Since spacings between adjacent semiconductor structures STb along the x-axis X are smaller than spacings between adjacent semiconductor structures STb along the y-axis Y, the gate dielectric GDb is not uncovered between the adjacent semiconductor structures STb along the xGR axis X. The gate lines GLb act as gate electrodes of the transistors. The gate lines GLb are in spacer form on sidewalls of the semiconductor structures STb which are parallel to the x-axis X.

Figure 7A:
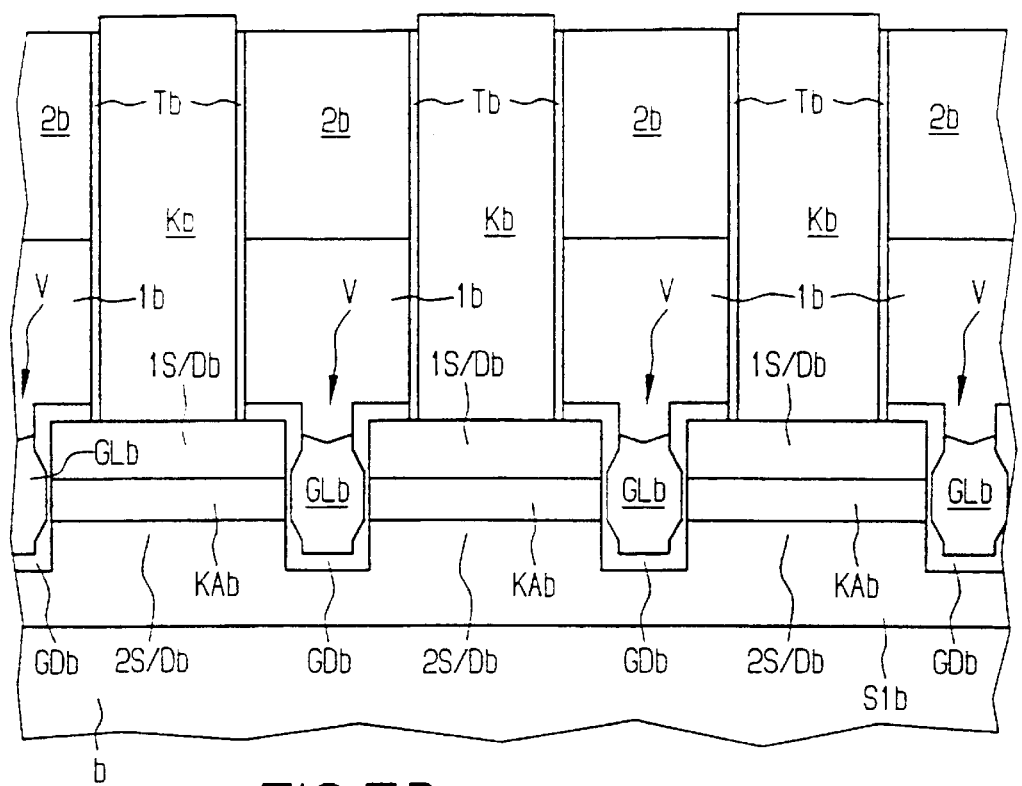
FIG. 7a is a cross-sectional view of FIG. 6a after a first insulating layer, isolating layers, contacts, write lines and a second insulating layer have been produced.
Figure 7B:
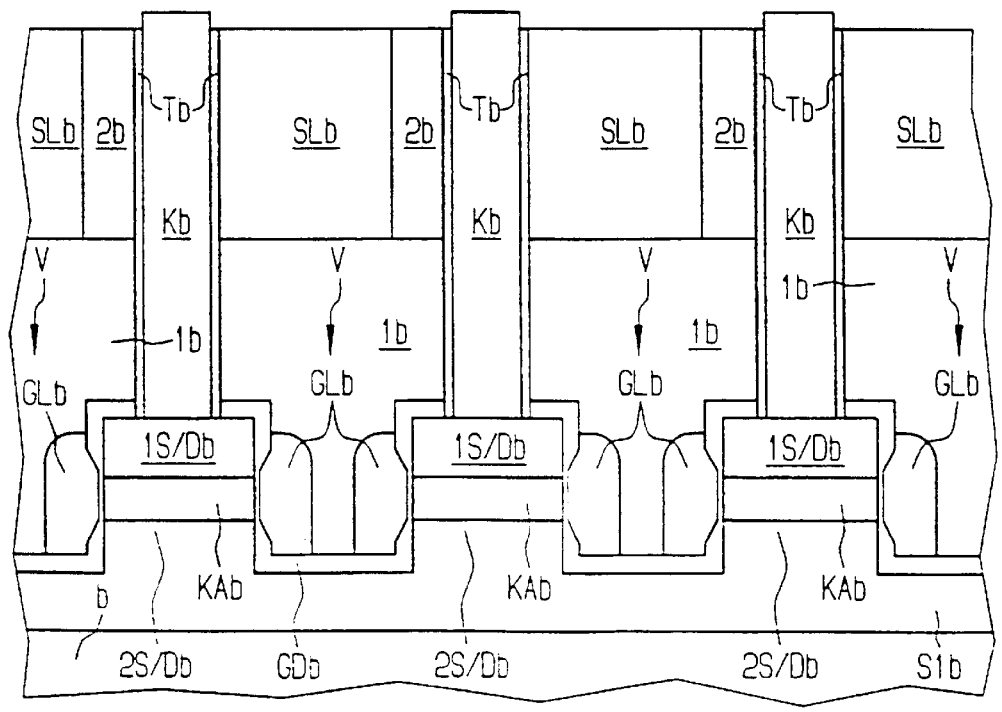

In order to produce a first insulating layer 1b, SiO$_2$ is deposited to a thickness of approximately 1500 nm and reduced to a thickness of approximately 1000 nm by chemical mechanical polishing. In order to produce write lines SLb, copper is deposited to a thickness of approximately 1 μm and patterned in strip form by a photolithographic method using e.g. BCl$_3$+Cl$_2$+CH$_4$. The strips of the write lines SLb run parallel to the x-axis X, are approximately 500 nm wide and have a spacing of approximately 500 nm from one another (see FIG. 7b). The write lines are disposed offset but not complementarily with respect to the second photoresist mask.

In order to produce a second insulating layer 2b, SiO$_2$ is deposited to a thickness of approximately 1 μm and planarized by chemical mechanical polishing until the upper areas of the write lines SLb are uncovered.

With the aid of a non-illustrated third photoresist mask, which does not cover rectangular regions which partly overlap the write lines SLb, SiO$_2$ is etched selectively with respect to the write lines SLb until the first source/drain regions 1S/Db are uncovered. The first insulating layer 1b and the second insulating layer 2b are cut through in the process. The rectangular regions are chosen in such a way as to produce contact holes which end at the first source/drain regions 1S/Db (see FIGS. 7a and 7b). In order to produce an isolating layer Tb, silicon nitride is deposited to a thickness of approximately 50 nm and etched back, as a result of which the isolating layer Tb is produced on the side areas of the contact holes in the form of spacers.

Afterward, tungsten is deposited to a thickness of approximately 500 nm and etched back, as a result of which the contact holes are filled with tungsten and contacts Kb are produced. The isolating layer Tb insulates the contacts Kb from the write lines SLb.

The write lines SLb and the second insulating layer 2b are removed by approximately 50 nm by chemical mechanical polishing. The contacts Kb project approximately 50 nm on account of the greater hardness of tungsten (see FIGS. 7a and 7b).

In order to produce the insulation 1b, $SiO_2$ is deposited to a thickness of approximately 100 nm and planarized by chemical mechanical polishing until an upper area of the contacts Kb is uncovered. As a result, insulation Ib having a thickness of approximately 50 nm is produced above the write lines SLb.

In a manner analogous to that in the first exemplary embodiment, a first magnetic layer F1b and a second magnetic layer F2b are produced, which are patterned in strip form by a photolithographic method (FIG. 8a), the strips running parallel to the x-axis X, being approximately 500 nm wide, having a spacing of approximately 500 nm from one another and partly covering the contacts Kb and also—in a manner isolated by the insulation Ib—the write lines SLb.

Figure 8A:
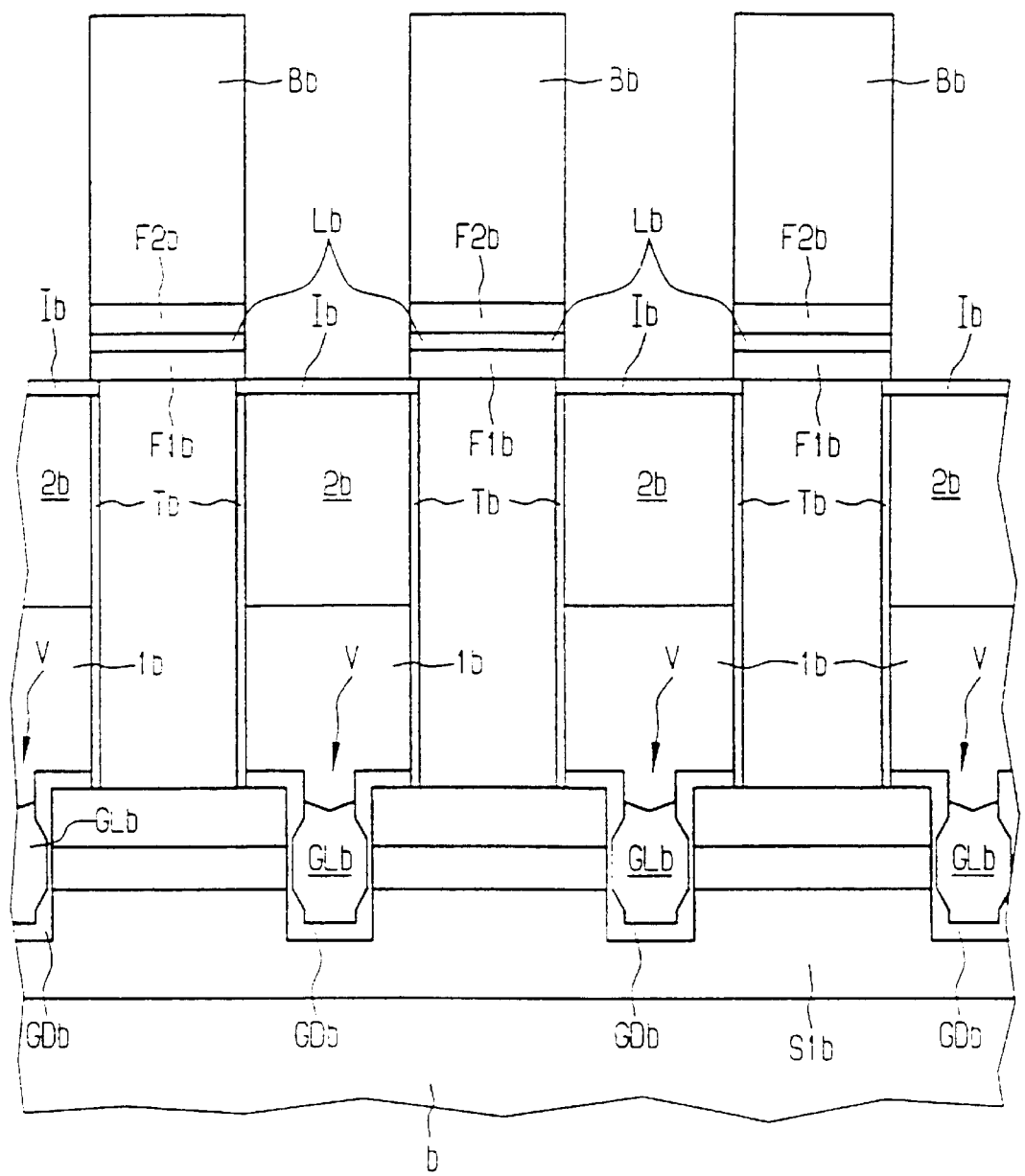
FIG. 8a is a cross-sectional view of FIG. 7a after an insulation, memory elements, a third insulating layer and bit lines have been produced.
Figure 8B:
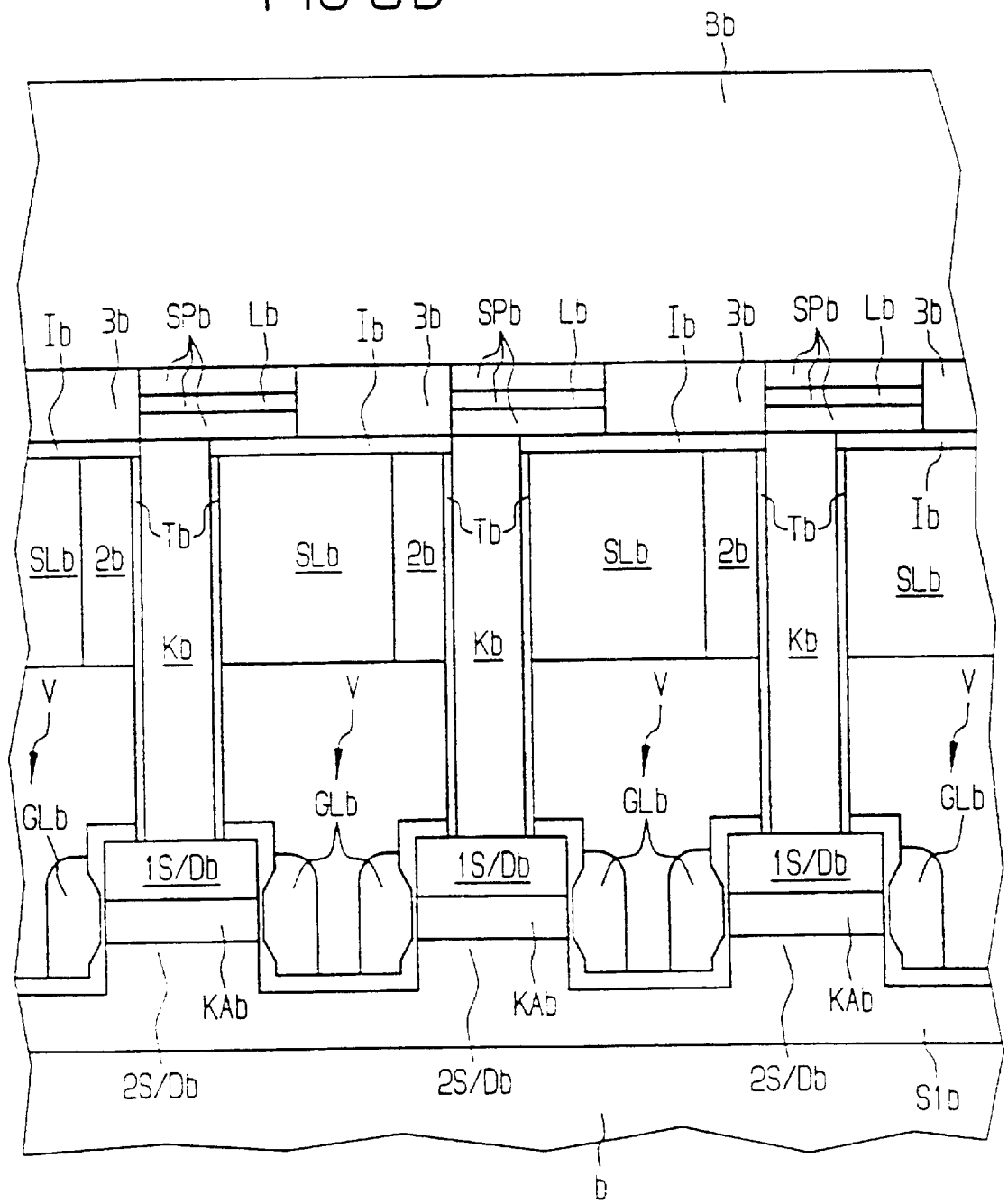

As in the first exemplary embodiment, bit lines Bb, a third insulating layer 3b analogous to the second insulating layer 2a, and memory elements SPb are produced, the bit lines Bb running parallel to the y-axis Y (see FIGS. 8a and 8b).

A second MRAM cell configuration is produced by the method described. In a third exemplary embodiment, a starting material is a third substrate c made of silicon that is p-doped and has a dopant concentration of approximately $10^{15}$ cm$^{-3}$.

Using a photolithographic method, depressions are etched into the third substrate c and filled with $SiO_2$. An insulating structure I1c is produced as a result. The insulating structure I1c includes strips running parallel to an x-axis X, and strips running parallel to a y-axis Y. The x-axis X runs perpendicularly to the y-axis Y. The strips running parallel to the y-axis Y are approximately 500 nm wide and have a spacing of approximately 2.5 µm from one another. The strips running parallel to the x-axis X are approximately 500 nm wide and have a spacing of approximately 500 nm from one another. The strips running parallel to the x-axis X are not continuous but rather are subdivided into regularly disposed sections. The sections each have a length of 2.5 µm. The strips running parallel to the y-axis Y cross the centers of the sections (see FIG. 9). The insulating structure I1c has a depth of approximately 500 nm.

A well W having a depth of approximately 500 nm and a dopant concentration of approximately $3*10^{17}$ cm$^{-3}$ is produced in the third substrate c by implantation with p-doping ions. Its dopant is activated by a heat-treatment step.

A gate dielectric GDc having a thickness of approximately 10 nm is produced on a surface Oc of the third substrate c by thermal oxidation (FIG. 10).

Afterward, tungsten silicide is produced to a thickness of approximately 200 nm on the surface Oc and, above the tungsten silicide, silicon nitride is deposited to a thickness of approximately 100 nm, the silicon nitride together with the tungsten silicide being patterned in strip form by a photolithographic method with the aid of a first photoresist mask (not illustrated). In this case, gate lines GLc which are parallel to the y-axis Y and are each approximately 500 nm wide are produced from the tungsten silicide. In each case two gate lines GLc are disposed between the strips of the insulating structure I1c which run parallel to the y-axis Y, the gate lines having a spacing of approximately 500 nm from one another (see FIG. 10). Afterward, silicon nitride is deposited to a thickness of approximately 100 nm and etched back, as a result of which spacers are produced on sidewalls of the gate lines GLc, which spacers, together with the silicon nitride, form etching stop structures Ac on the gate lines GLc (see FIG. 10).

An implantation with n-doping ions is subsequently carried out, the gate lines GLc acting as a mask. First source/drain regions 1S/Dc and second source/drain regions 2S/Dc of planar transistors are produced in the process (see FIG. 10). The second source/drain regions 2S/Dc are produced in each case between the two mutually adjacent gate lines GLc disposed between the strips of the first insulating structure I1c which run along the y-axis Y. The first source/drain regions 1S/Dc and the second source/drain regions 2S/Dc have a depth of approximately 100 nm. Parts of the well W which lie underneath the gate lines GLc and in each case between a first source/drain region 1S/Dc and a second source/drain region 2S/Dc act as channel regions KAc of the transistors. Parts of the gate lines GLc which are disposed above the channel regions KAc act as gate electrodes of the transistors. The second source/drain regions 2S/Dc of adjacent transistors along the y-axis Y form a common strip-type doped region and are consequently electrically connected to one another. Second source/drain regions 2S/Dc of two respective transistors which are adjacent to one another along the x-axis X and are disposed between adjacent strips of the first insulating structure I1c which run along the y-axis Y coincide.

In order to produce a first insulating layer 1c, $SiO_2$ is deposited to a thickness of approximately 1.5 µm and reduced to a thickness of approximately 1 µm by chemical mechanical polishing. Contact holes are produced above the first source/drain regions 1S/Dc by a photolithographic method. A suitable etchant is e.g. $CHF_3+O_2$.

Figure 11:
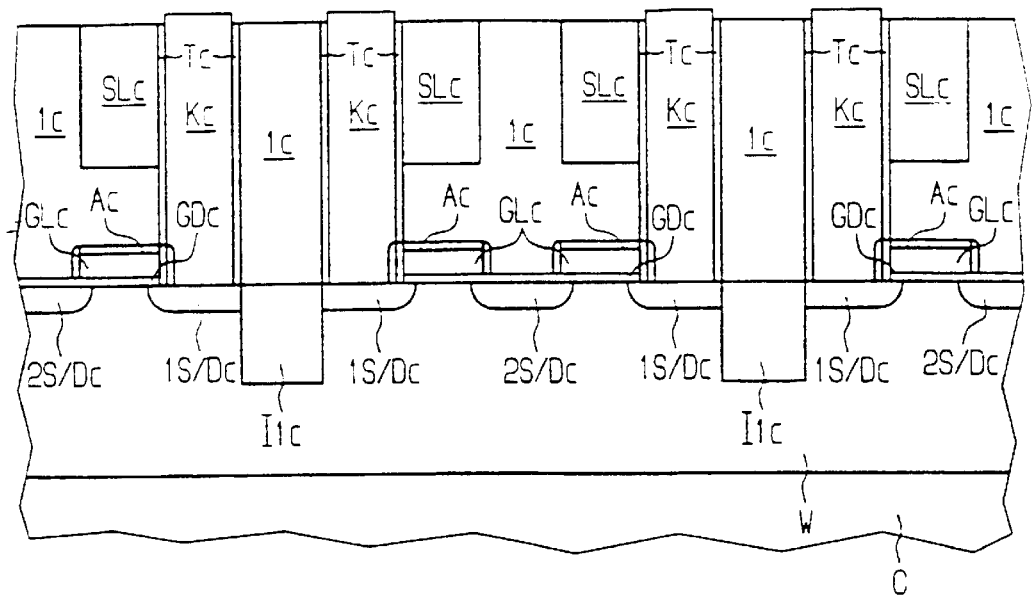
Figure 11:
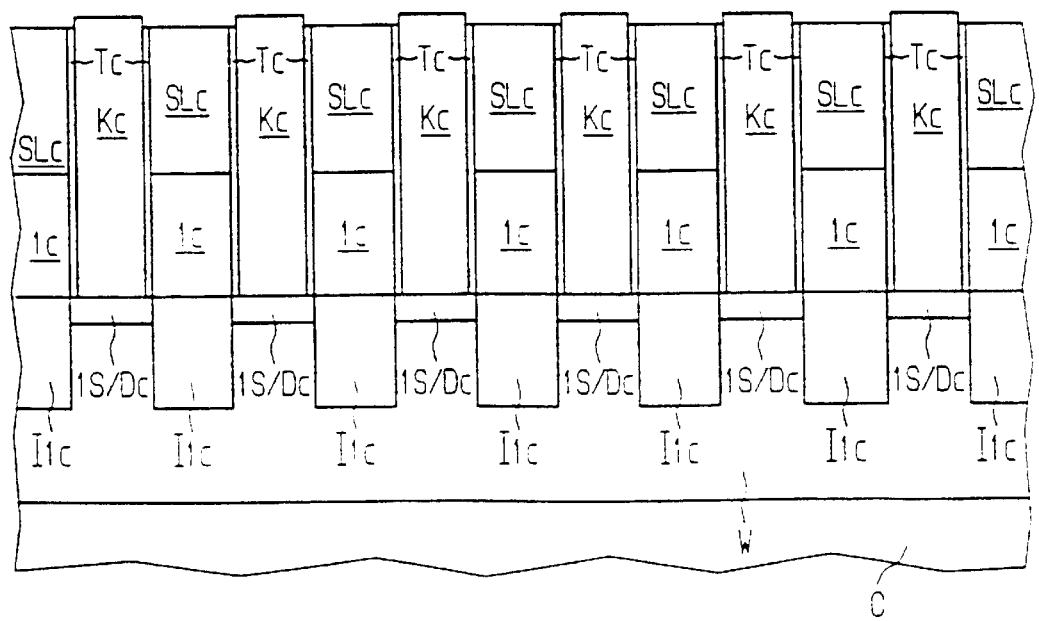

In order to produce an isolating layer Tc, silicon nitride is deposited to a thickness of approximately 50 nm and etched back, as a result of which the isolating layer Tc is produced in spacer form on side areas of the contact holes (see FIGS. 11a and 11b). Afterward, tungsten is deposited to a thickness of approximately 500 nm and etched back, as a result of which the contact holes are filled and contacts Kc are produced, which make contact with the first source/drain regions 1S/Dc. A suitable etchant is e.g. $SF_6+H_2+O_2$ (see FIGS. 11a and 11b).

With the aid of a strip-type second photoresist mask (not illustrated), $SiO_2$ is etched selectively with respect to tungsten and silicon nitride to a depth of approximately 500 nm using e.g. $C_2S_6+O_2$. The strips of the second photoresist mask are essentially complementary to the strips of the first photoresist mask provided for the production of the gate lines GLc, with the difference that the strips are somewhat thinner and therefore the contacts Kc are partly uncovered.

Copper is subsequently deposited to a thickness of approximately 1 µm, as a result of which write lines SLc are produced adjoining the contacts Kc—in a manner isolated by the isolating layer Tc.

Copper and $SiO_2$ are removed by chemical mechanical polishing until the contacts Kc project approximately 50 nm on account of their greater hardness (see FIGS. 11a and 11b).

Figure 12A:
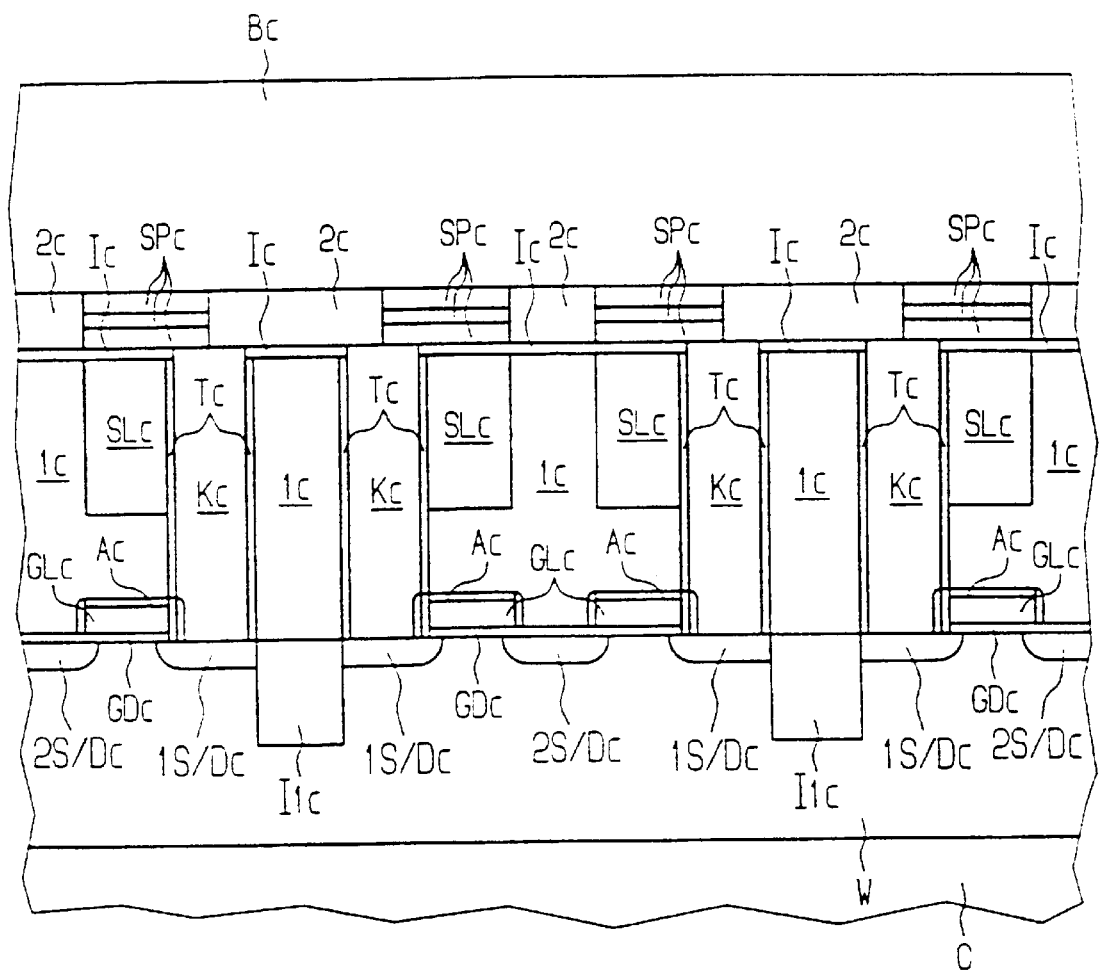
FIG. 12a is a cross-sectional view of FIG. 11a after an insulation, memory elements, a second insulating layer and bit lines have been produced.

Afterward, in a manner analogous to that in the previous two exemplary embodiments the insulation Ic, memory elements SPc, a second insulating layer 2c and bit lines Bc running parallel to the x-axis X are produced (see FIGS. 12a and 12b).

A third MRAM cell configuration is produced by the method described. In a fourth exemplary embodiment, a fourth substrate d is a silicon wafer which is p-doped and has a dopant concentration of approximately $10^{15}$ cm$^{-3}$ (FIG. 13). In a manner analogous to that in the first exemplary embodiment, a first layer S1d, a second layer S2d, strip-type doped regions, a first mask M1d, trenches Gd running perpendicularly to an x-axis X, strip-type semiconductor structures STd, first source/drain regions 1S/Dd, channel regions KAd, second source/drain regions 2S/Dd, channel stop regions Cd, a gate dielectric GDd and gate lines G1d are produced.

In order to produce a first insulating layer 1d, SiO$_2$ is deposited to a thickness of approximately 1 μm and planarized down to a thickness of approximately 500 nm by chemical mechanical polishing (see FIG. 13). Afterward, a first metal layer made of AlSiCu is produced to a thickness of approximately 1 μm, above that an insulation Id made of SiO$_2$ and having a thickness of approximately 20 nm is produced, and above that a second metal layer Me2 made of tungsten and having a thickness of approximately 20 nm is produced. Above the second metal layer Me2, a first magnetic layer F1d made of Co and having a thickness of approximately 10 nm is produced, above that a dielectric Ed made of Al$_2$O$_3$ and having a thickness of approximately 3 nm is produced, above that a second magnetic layer F2d made of NiFe and having a thickness of approximately 10 nm is produced, above that a third metal layer Me3 made of tungsten and having a thickness of approximately 20 nm is produced, above that a second insulating layer 2d made of SiO$_2$ and having a thickness of approximately 20 nm is produced, and above that a fourth metal layer Me4 made of tungsten and having a thickness of approximately 20 nm is produced. With the aid of a strip-type photoresist mask (not illustrated), whose strips run in a somewhat offset manner with respect to the trenches Gd, all of the layers enumerated above up to and including the first metal layer are cut through. In this case, write lines SLd running parallel to the y-axis Y are produced from the first metal layer (see FIG. 13).

In order to produce a third insulating layer 3d, SiO$_2$ is deposited to a thickness of approximately 500 nm and planarized by chemical mechanical polishing until the third metal layer Me3, which acts as an etching stop, is uncovered.

In order to produce a fourth insulating layer 4d, SiO$_2$ is deposited to a thickness of approximately 20 nm.

A mask made of tungsten M2d is subsequently produced by tungsten being deposited to a thickness of approximately 20 nm and being photolithographically patterned. The mask made of tungsten M2d does not cover rectangular regions. The rectangular regions are disposed in such a way that part of the fourth metal layer Me4 and also the first source/drain regions 1S/Dd are uncovered during the subsequent etching of SiO$_2$ (see FIG. 14).

Figure 14:
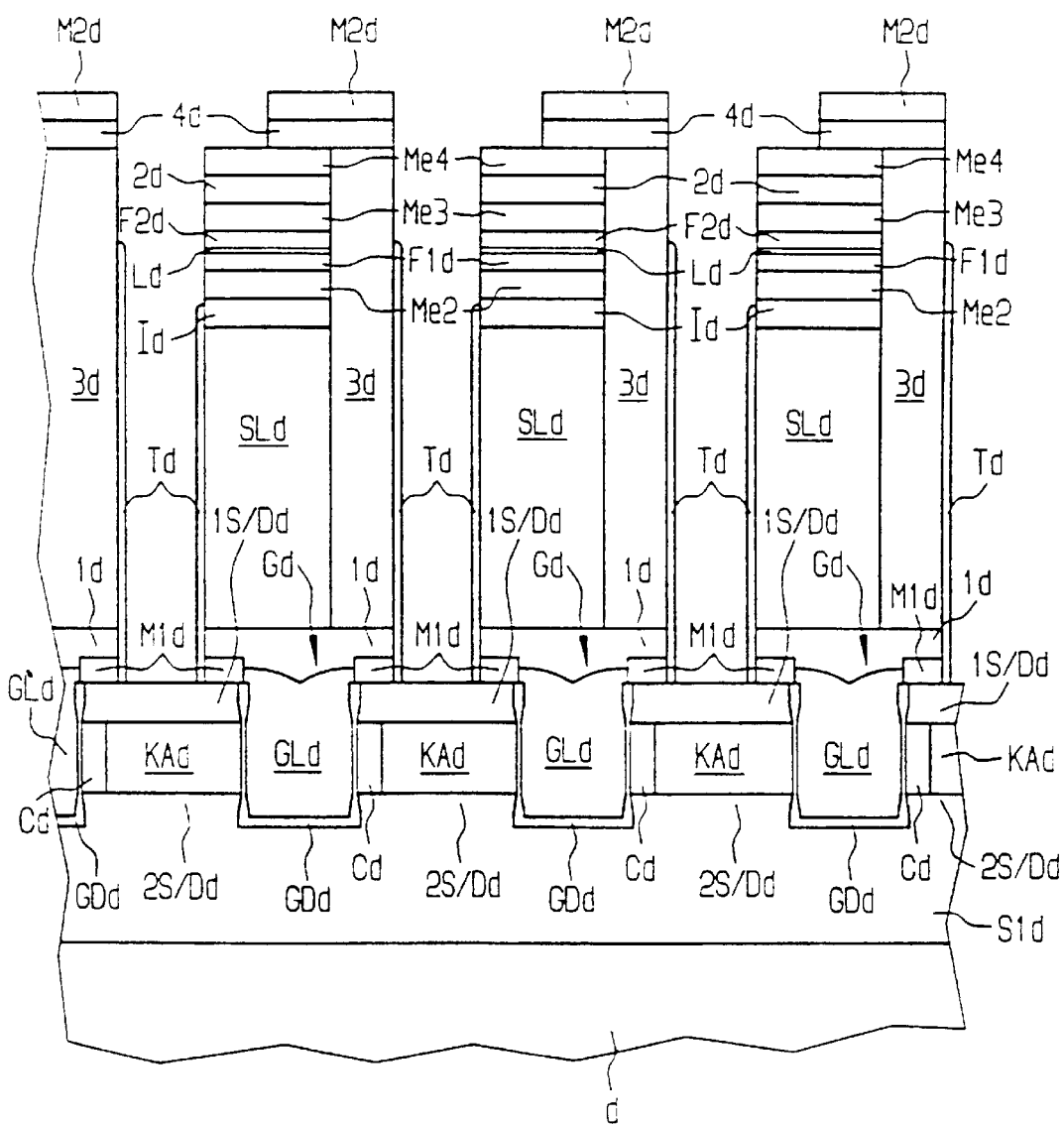
FIG. 14 is a cross-sectional view of FIG. 13 after a third insulating layer, a fourth insulating layer, a second mask, contact holes and isolating layers have been produced.

In order to produce an isolating layer Td, SiO$_2$ is deposited to a thickness of approximately 50 nm and etched back until the second metal layer Me2, which acts as an etching stop, is uncovered but the write lines SLd are not uncovered (see FIG. 14).

In order to produce contacts Kd, tungsten is subsequently deposited to a thickness of approximately 500 nm and planarized by chemical mechanical polishing until the fourth insulating layer 4d is uncovered. The mask made of tungsten M2d is removed in the process. Tungsten is subsequently etched back selectively with respect to SiO$_2$ until an upper area of the contacts Kd produced lies in the region of the second metal layer Me2, the fourth insulating layer 4d acting as a mask. Part of the fourth metal layer Me4 is removed in the process. The contacts Kd in each case connect a first source/drain region 1S/Dd to part of the second metal layer Me2 (see FIG. 15).

In order to produce a fifth insulating layer 5d, SiO$_2$ is deposited to a thickness of approximately 500 nm and planarized by chemical mechanical polishing until an upper area of the fourth metal layer Me4 is uncovered. The fourth metal layer Me4 is removed with the aid of SF$_6$+H$_2$+O$_2$.

SiO$_2$ is subsequently planarized by chemical mechanical polishing until an upper area of the third metal layer Me3 is uncovered. The second insulating layer 2d is removed in the process.

Figure 16A:
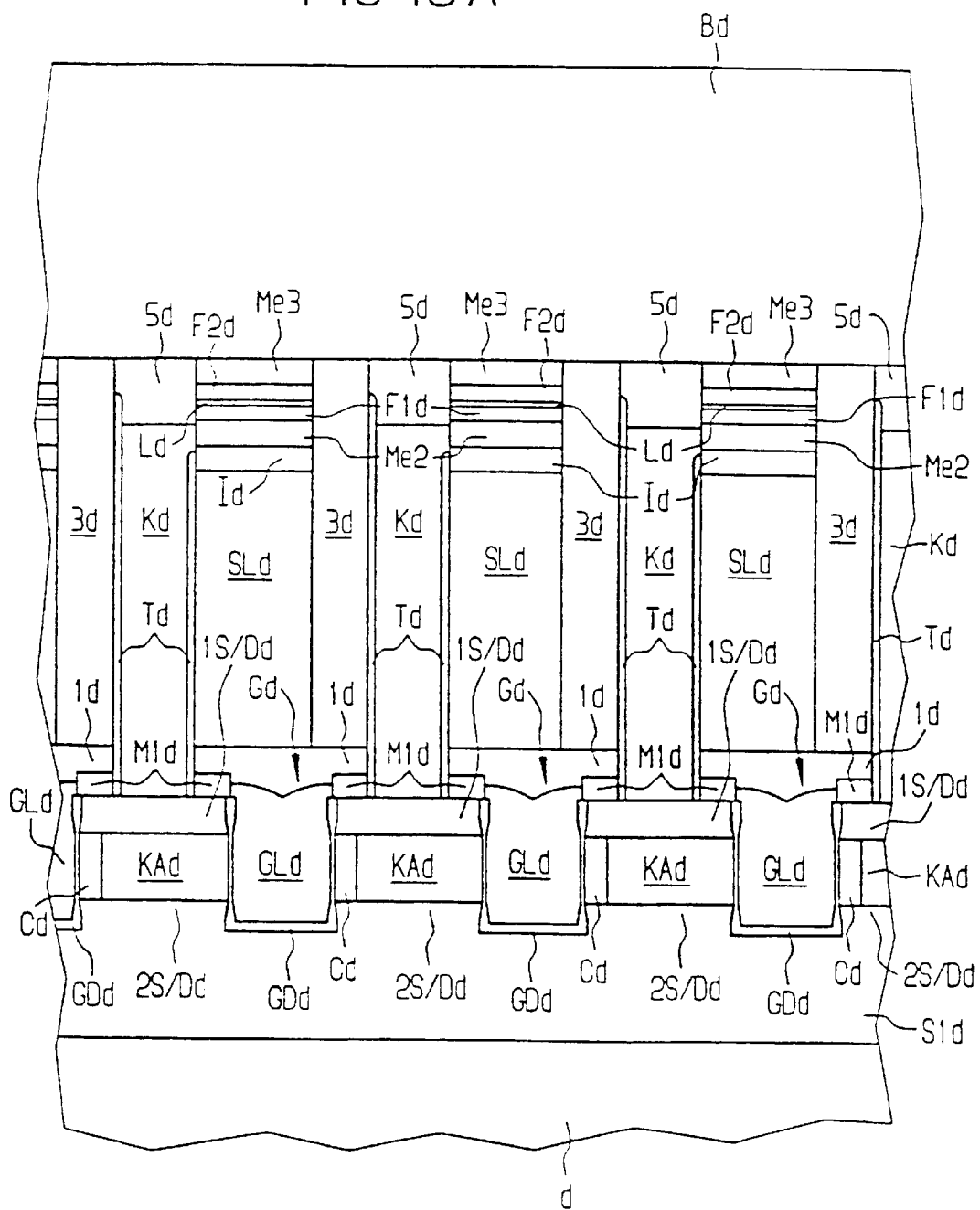
FIG. 16a is a cross-sectional view of FIG. 15 after a fifth insulating layer and bit lines have been produced.
Figure 16B:
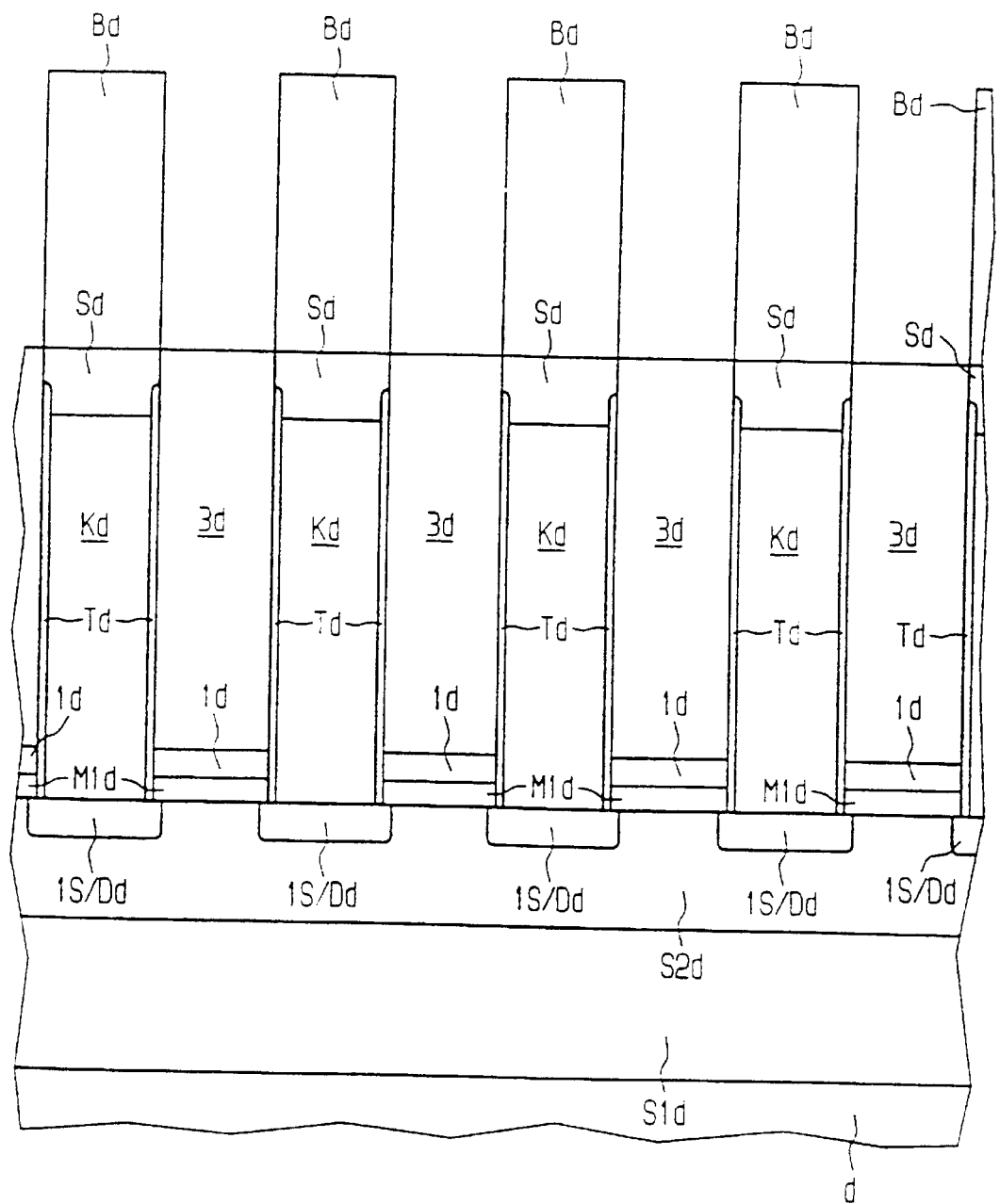

In order to produce bit lines Bd, AlSiCu is deposited to a thickness of approximately 1 μm and etched together with the third metal layer Me3, the second magnetic layer F2d, the dielectric Ed, the first magnetic layer F1d and the second metal layer Me2. This produces memory elements which each include part of the second metal layer Me2, part—disposed above the latter—of the first magnetic layer F1d, part—disposed above the latter—of the dielectric Ed, part—disposed above the latter—of the second magnetic layer F2d and part—disposed above the latter—of the third metal layer Me3. The write lines SLd are isolated from the memory elements by the insulation Id (see FIGS. 16a and 16b).

A fourth MRAM cell configuration is produced by the method described. For connection to the transistors, the memory elements are contact-connected from the side.

Figure 17:
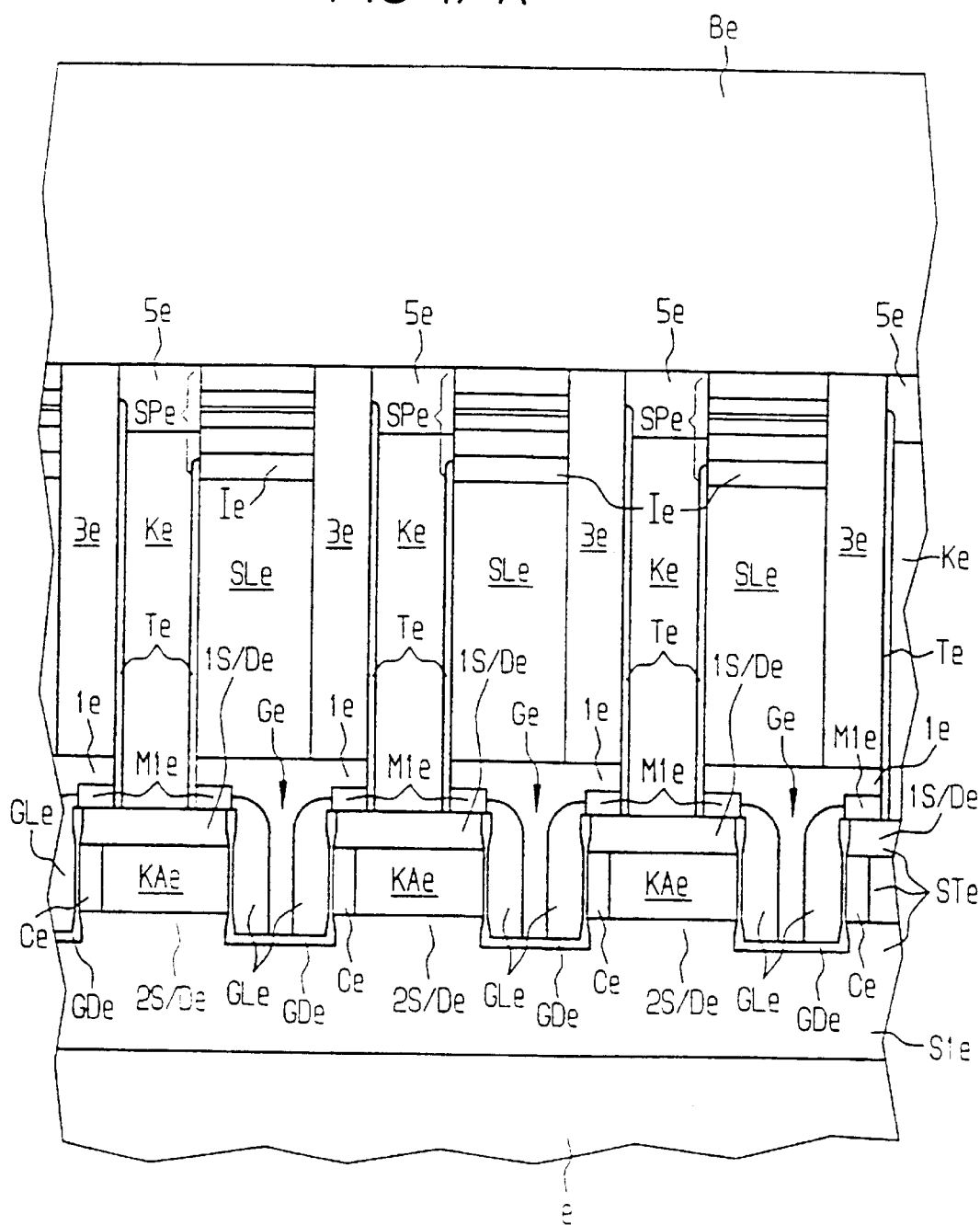
FIG. 17a is a cross-sectional view through a fifth substrate after the production of a fifth MRAM cell configuration, in which a memory cell contains a vertical transistor and a memory element, two gate lines in each case having been produced in trenches.
FIG. 17b is a circuit diagram of the fifth MRAM cell configuration.

In a fifth exemplary embodiment, a fifth substrate e is a silicon wafer that is p-doped and has a dopant concentration of approximately $10^{15}$ cm$^{-3}$ (FIG. 17a). In a manner analogous to that in the fourth exemplary embodiment, a first layer S1e, a second layer, strip-type doped regions, a first mask M1e, trenches Ge, semiconductor structures STe, first source/drain regions 1S/De, channel regions KAe and second source/drain regions 2S/De are produced.

With the aid of a strip-type first photoresist mask, whose strips cover every second strip-type region, first sidewalls of the trenches Ge are doped by inclined implantation. P-doped channel stop regions Ce are produced in the process. With the aid of a strip-type second photoresist mask, which covers the strip-type regions that were not covered previously, the second sidewalls of the trenches Ge are implanted by inclined implantation. Further of the channel stop regions Ce are produced in the process. The dopant concentration of the channel stop regions Ce is approximately $10^{19}$ cm$^{-3}$. Adjacent channel stop regions Ce along one of the trenches Ge are disposed alternately on the first side wall and on the second side wall of the trench Ge.

A gate dielectric GDe having a thickness of approximately 10 nm is produced by thermal oxidation.

In order to produce gate lines GLe, in-situ n-doped polysilicon is deposited to a thickness of approximately 150 nm and etched back until the gate lines GLe are produced in the form of spacers on the first sidewalls and on the second sidewalls of the trenches Ge. Parts of the gate lines GLe that are disposed in regions of the channel regions KAe act as gate electrodes of the transistors.

Afterward, in a manner analogous to that in the fourth exemplary embodiment, insulating layers 1e, 3e, 5e, write lines SLe, an insulation Ie, memory elements SPe, contacts Ke, isolating layers Te and bit lines Be are produced (see FIG. 17a).

Figure 17B:
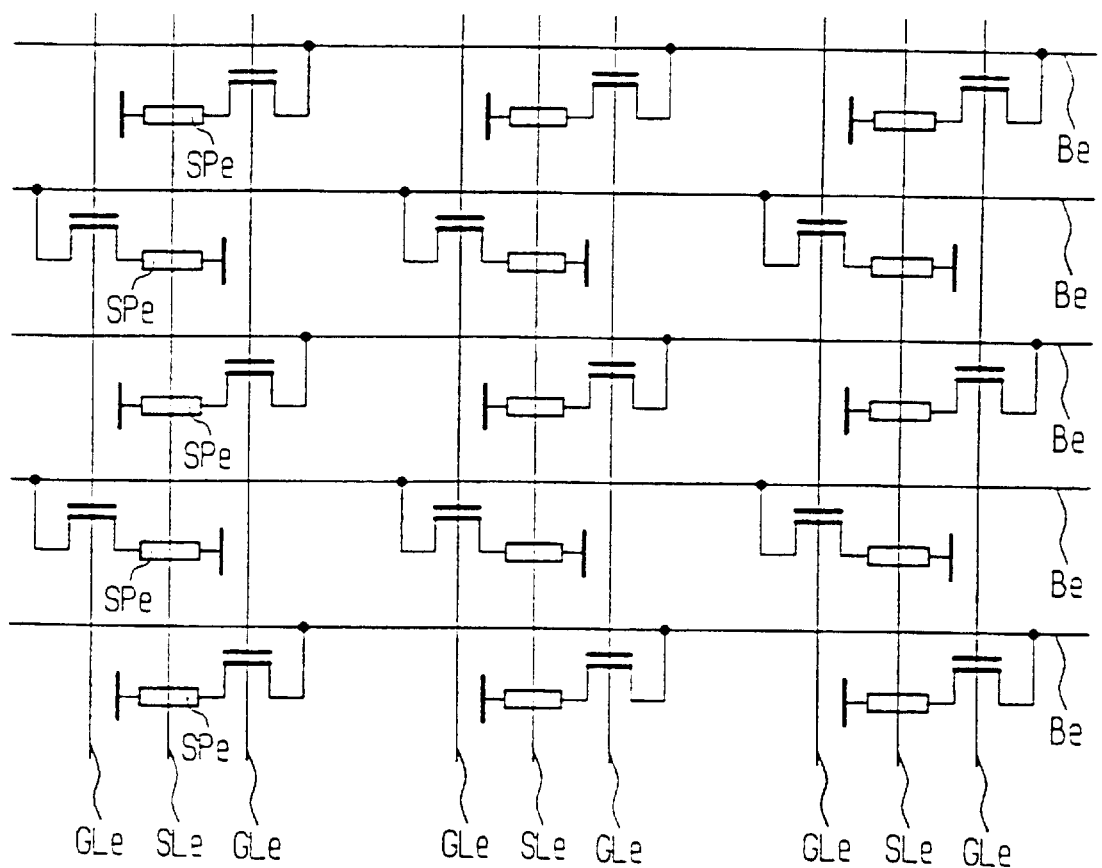

A fifth MRAM cell configuration is produced by the method described. The fifth MRAM memory cell configuration has folded bit lines Be since the alternating configuration of the channel stop regions Ce ensures that adjacent memory cells along the trench Ge, i.e. memory cells which are connected to mutually adjacent bit lines Be, are not driven by the same gate line GLe (see FIG. 17b).

Figure 18:
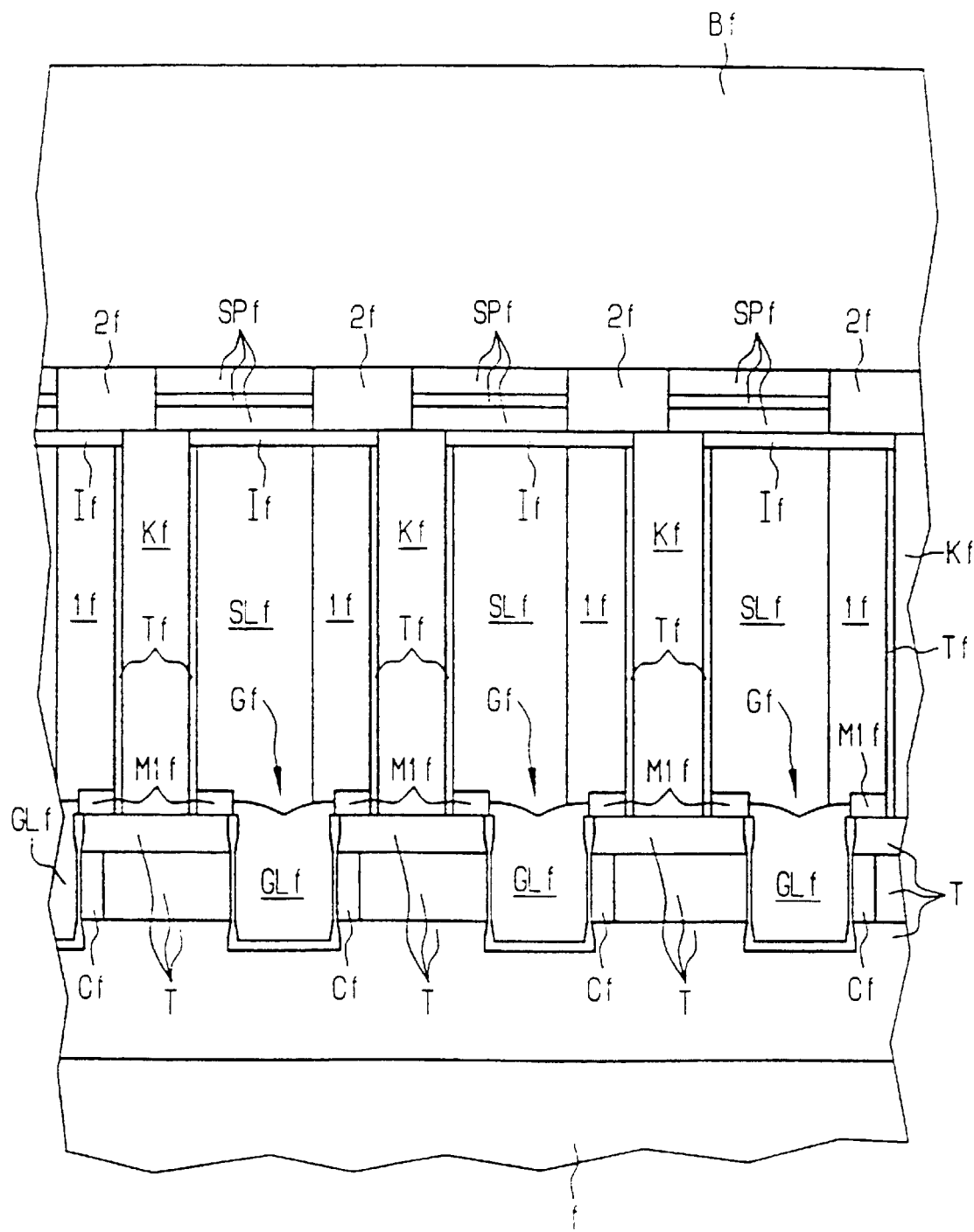
FIG. 18a is a cross-sectional view through a sixth substrate after the production of a sixth MRAM cell configuration, in which a memory cell comprises a vertical transistor, and in which a gate line is electrically connected to a write line.
FIG. 18b is a circuit diagram of the sixth MRAM cell configuration.

In a sixth exemplary embodiment, in a manner analogous to that in the first exemplary embodiment, proceeding from a sixth substrate f, a first mask M1f, trenches Gf, vertical transistors T, channel stop regions Cf, gate lines GLf, write lines SLf, isolating layers Tf, contacts Kf and a first insulating layer If are produced, with the difference that the first mask M1f is produced from silicon nitride (FIG. 18a). In contrast to the first exemplary embodiment, during the production of the write lines SLf, etching is carried out until the gate lines GLf are uncovered. Filling with copper results in the write lines SLf being produced adjoining the gate lines GLf. In a manner analogous to that in the first exemplary embodiment, an insulation If, memory elements SPf, a second insulating layer 2f and bit lines Bf are produced (see FIG. 18a).

A sixth MRAM cell configuration is produced by the method described. During the programming of one of the memory cells, the associated transistor T is driven since the associated write line SLf is electrically connected to the gate line GLf of the transistor T (see FIG. 18b).

Figure 19A:
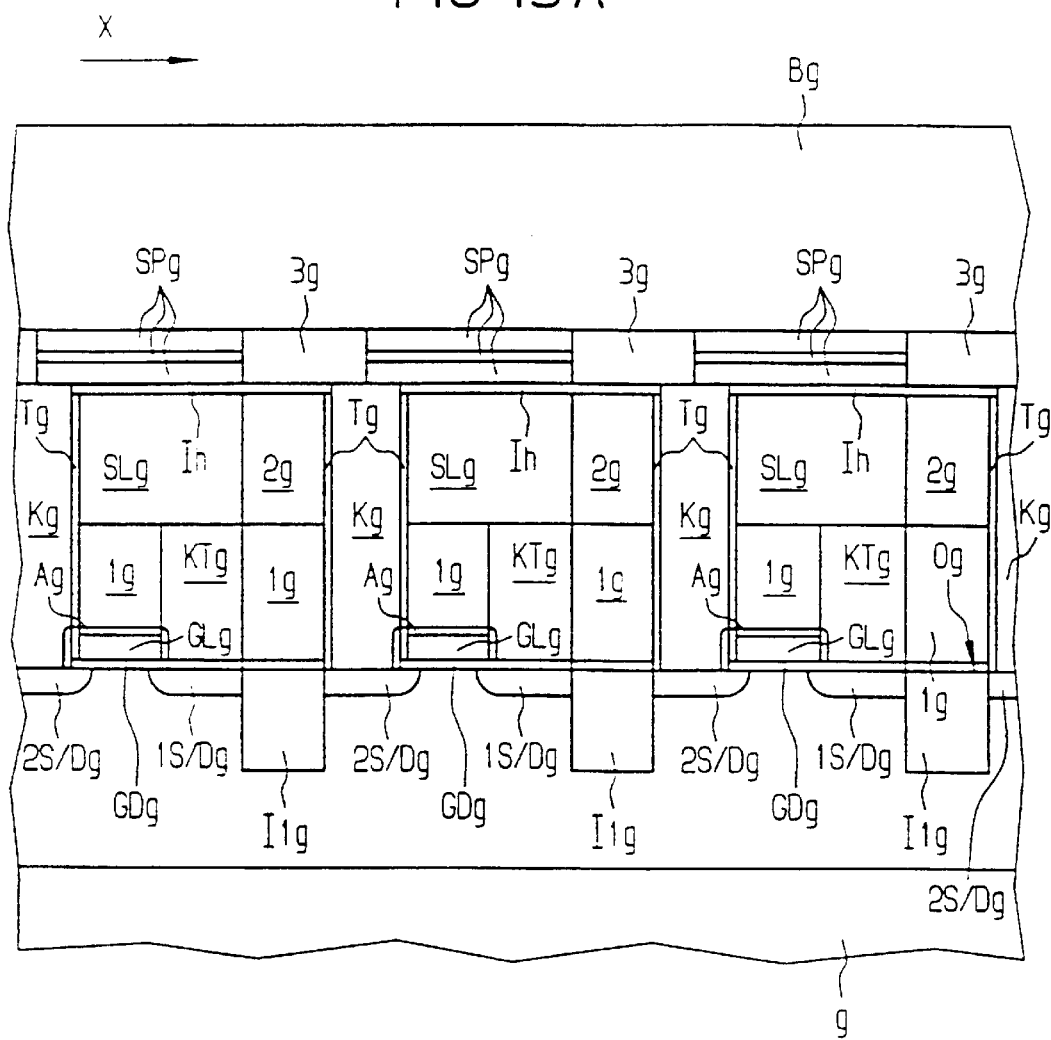
FIG. 19a is a cross-sectional view through a seventh substrate after the production of a seventh MRAM cell configuration, in which a memory cell contains a planar transistor, and the memory cell is connected between a write line and a bit line.

In a seventh exemplary embodiment, a seventh substrate g is a silicon wafer that is p-doped and has a dopant concentration of approximately $10^{15}$ cm$^{-3}$ (FIG. 19a). In order to produce an insulating structure I1g, depressions are produced by a photolithographic method and are filled with $SiO_2$. The insulating structure I1g has strips running parallel to a y-axis and strips running parallel to an x-axis X. The y-axis runs perpendicularly to the x-axis X, and both run parallel to a surface Og of the seventh substrate g. The strips of the insulating structure I1g which run parallel to the y-axis have a width of approximately 500 nm and a spacing of approximately 1500 nm from one another. The strips of the structure I1g which run parallel to the x-axis X have a width of approximately 500 nm and a spacing of approximately 500 nm from one another.

In a similar manner to that in the third exemplary embodiment, planar transistors, gate lines GLg running parallel to the y-axis, and etching stop structures Ag are produced. A transistor in each case is disposed between two mutually adjacent strips of the insulating structure I1g which run parallel to the y-axis Y.

After the production of the etching stop structures Ag, in order to generate a first insulating layer 1g, $SiO_2$ is deposited to a thickness of approximately 1 μm and planarized by chemical mechanical polishing. A photolithographic method is used to produce contact holes as far as a respective first source/drain region 1S/Dg of the transistors. The contact holes are subsequently filled with tungsten in order to produce deep contacts KTg. In order to produce a second insulating layer 2g, $SiO_2$ is deposited to a thickness of approximately 1 μm and planarized.

As in the third exemplary embodiment, contacts Kg are produced above second source/drain regions 2S/Dg of the transistors, said contacts being provided with an isolating layer Tg on the side areas.

In a similar manner to that in the third exemplary embodiment, write lines SLg are produced, with the difference that the write lines SLg are so wide that they overlap the deep contacts KTg. The first source/drain regions 1S/Dg are thus connected to the write lines SLg.

In a manner analogous to that in the previous exemplary embodiments, an insulation Ig, memory elements SPg, a third insulating layer Sg and bit lines Bg are produced (see FIG. 19a).

Figure 19B:
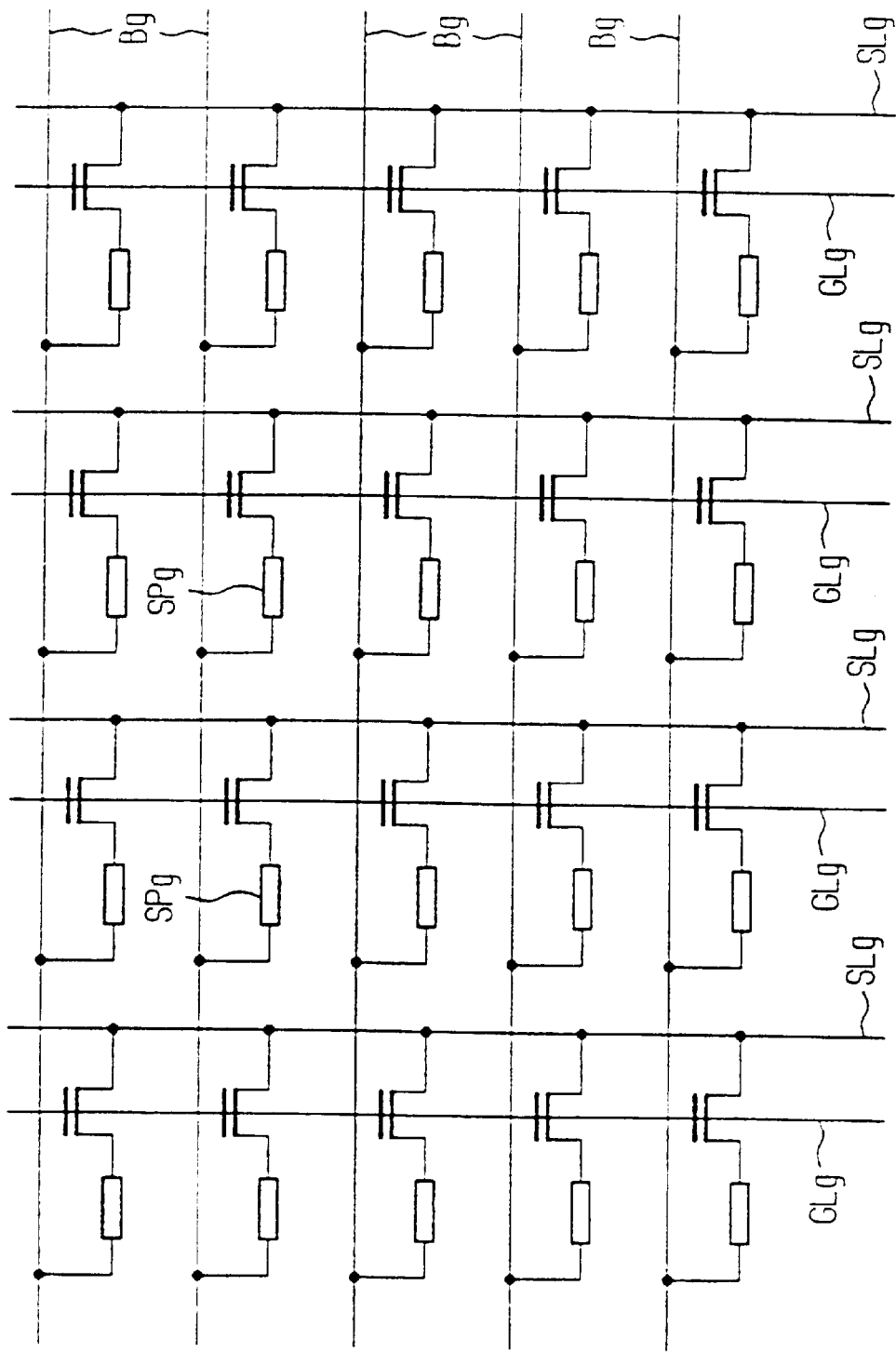
FIG. 19b is a circuit diagram of the seventh MRAM cell configuration.

A seventh MRAM cell configuration is produced by the method described. Memory cells each include one of the transistors and one of the memory elements, which are connected in series. The memory cells are each connected between the associated bit line Bg and the associated write line SLg (see FIG. 19b).

Figure 20:
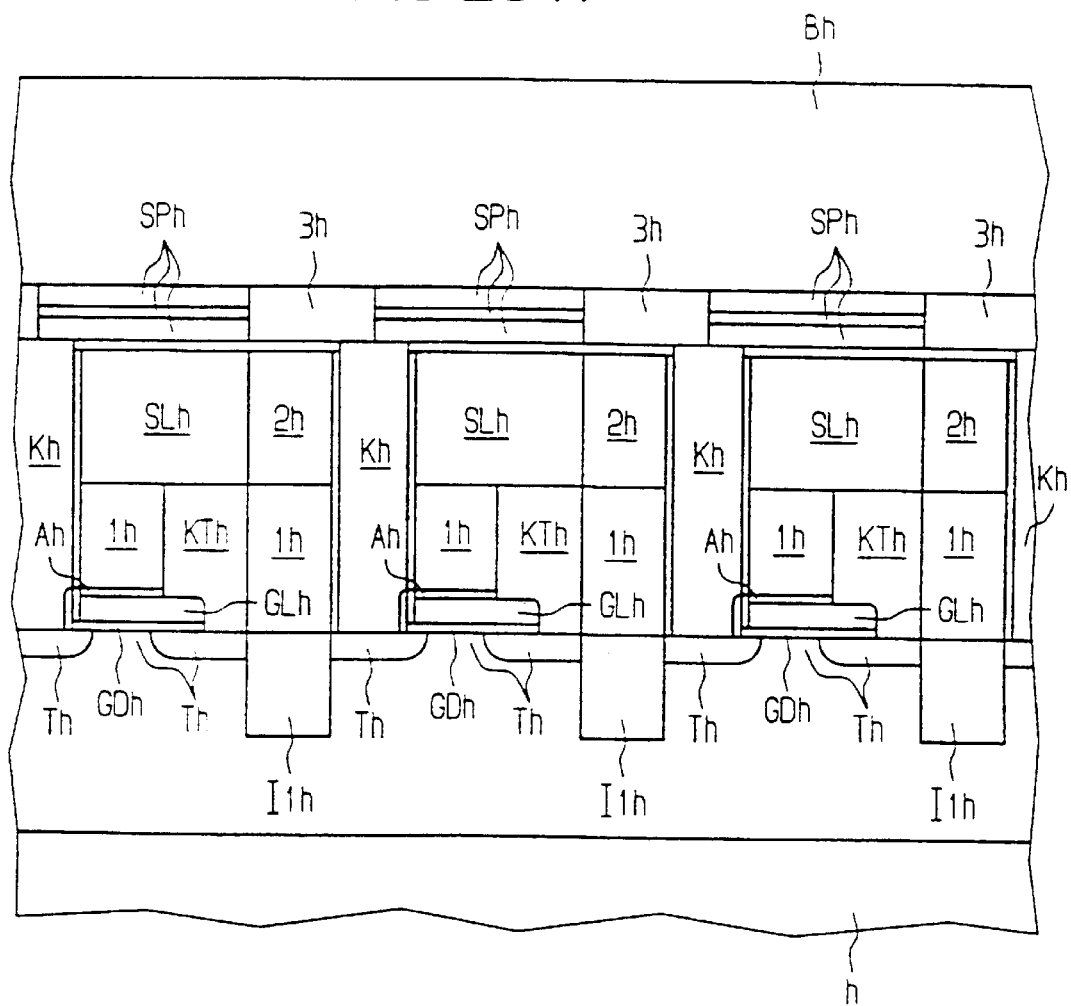
FIG. 20a is a cross-sectional view through an eighth substrate after the production of an eighth MRAM cell configuration, in which a memory cell contains a planar transistor, in which the memory cell is connected between a write line and a bit line and in which the write line is electrically connected to a gate line.
FIG. 20b is a circuit diagram of the eighth MRAM cell configuration.
Figure 20:
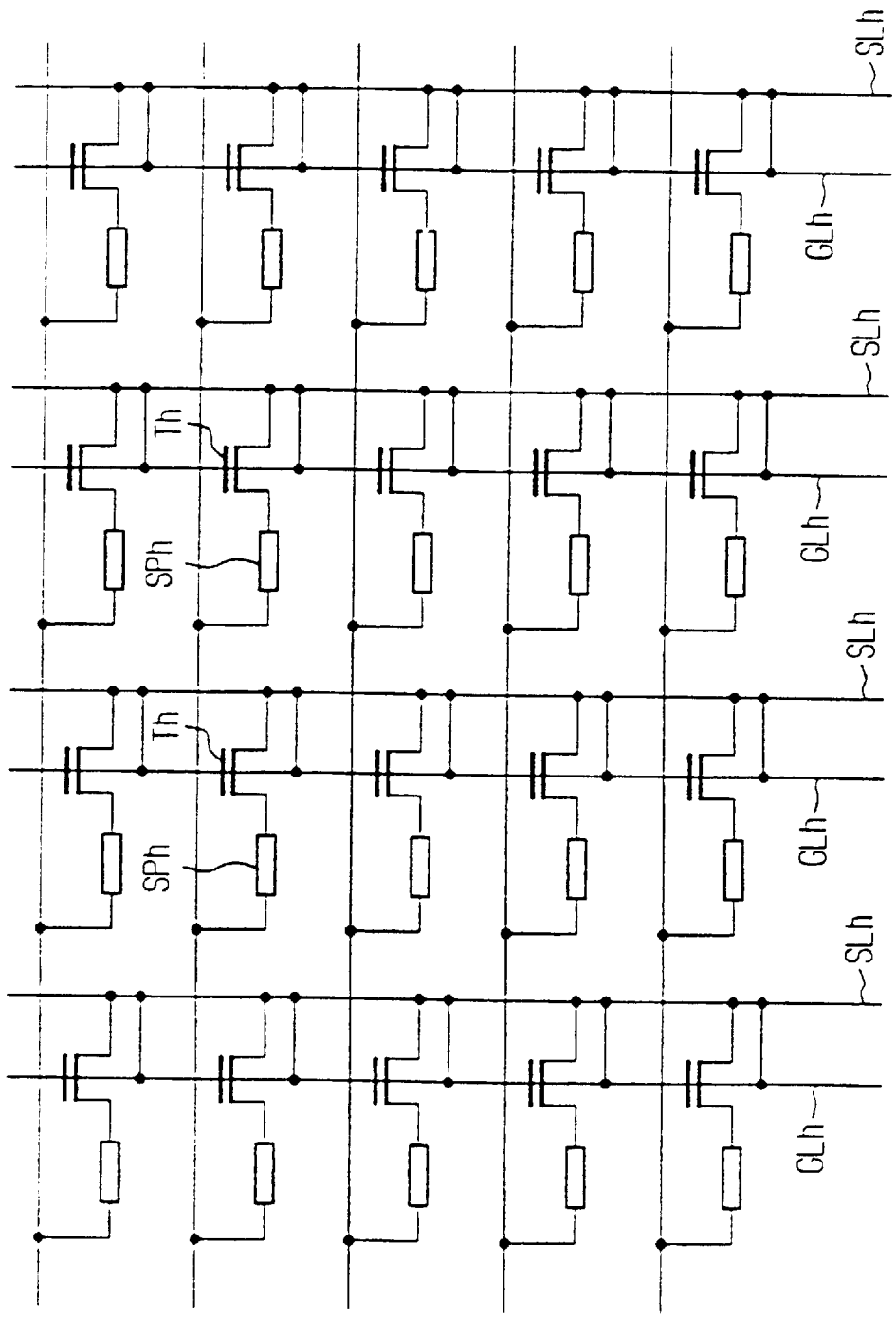

In an eighth exemplary embodiment, proceeding from an eighth substrate h, an insulating structure I1h, planar transistors Th, gate lines GLh, etching stop structures Ah and a first insulating layer 1h are produced as in the seventh exemplary embodiment (FIG. 20a).

In a similar manner to that in the seventh exemplary embodiment, contact holes for deep contacts KTh are produced, with the difference that the etching stop structures Ah made of silicon nitride are likewise etched. A suitable etchant is e.g. $CHF_3+O_2$. As a result, the lower contacts KTh additionally make contact with the gate lines GLh.

As in the seventh exemplary embodiment, a second insulating layer 2h, contacts Kh, write lines SLh, memory elements SPh, a third insulating layer 3h and bit lines Bh are produced (see FIG. 20a).

An eighth MRAM cell configuration is produced by the method described. Memory cells each include one of the transistors Th and one of the memory elements SPh, which are connected in series. The memory cells are each connected between the associated bit line Bh and the associated write line SLh. During the programming of one of the memory cells, the associated transistor Th is driven since the associated write line SLh is electrically connected to the gate line GLh of the transistor Th (see FIG. 20b).

There are many conceivable variations of the exemplary embodiments that likewise lie within the scope of the invention. In particular, the dimensions of the above-described layers, trenches, masks, spacers, regions, lines and structures can be adapted as desired to the respective requirements. The same also applies to the proposed dopant concentrations. Conductivity types of the layers, regions, wells and substrates can be interchanged. The exemplary embodiments can be scaled, for example. To that end, the dimensions are corrected in accordance with a scaling factor.

Features of the eight exemplary embodiments can be combined with one another. One difference between the fourth and fifth exemplary embodiments is that folded bit lines are provided in the fifth exemplary embodiment, the folded bit lines being realized with the aid of alternately disposed channel stop regions and by the configuration of two gate lines per trench. These features can readily be integrated into the first and sixth exemplary embodiments in order to obtain variants with folded bit lines. Features from the fourth and fifth exemplary embodiments which enable lateral contact-making of the memory elements can replace the contact-making from below.

We claim:

1. A method for fabricating a memory cell configuration, which comprises the steps of:

producing trenches running essentially parallel to one another in a substrate and as a result of which strip-type semiconductor structures are produced;

producing first source/drain regions of vertical transistors in the strip-type semiconductor structures;

producing channel regions of the vertical transistors under the first source/drain regions in the strip-type semiconductor structures;

producing channel stop regions at least on parts of side walls of the strip-type semiconductor structures by inclined implantation;

producing gate lines for driving the transistors in the trenches;

forming memory elements each connected to one of the transistors and together defining memory cells, each of the memory elements having an electrical resistance representing an information item which can be influenced by a magnetic field;

producing bit lines disposed transversely with respect to the gate lines and connected to the memory cells; and producing write lines disposed transversely with respect to the bit lines, the write lines cross the bit lines in regions of the memory elements.

2. The method according to claim 1, which comprises:

forming the channel stop regions by use of two masked inclined implantations in such a way that they are disposed along the semiconductor structure alternately on a first side wall and on a second side wall of the semiconductor structures; and producing two of the gate lines in each of the trenches by depositing a conductive material and etching back the conductive material until the gate lines are produced as spacers.

3. The method according to claim 1, which comprises:

producing contacts on the first source/drain regions of the transistors;

forming one of the write lines, next to each of the contacts, the write lines being produced from a softer material than a material of the contacts, an upper area of the write lines lying at one of a same level and higher than a level of an upper area of the contacts;

removing each of the write lines by chemical mechanical polishing until the contacts protrudes somewhat;

producing an insulation on the write lines with an insulating material being deposited and planarized until the upper area of the contacts is uncovered;

producing each of the memory elements, above the insulation and above and adjoining one of the contacts; and producing the bit lines running transverse with respect to the write lines above the memory elements and electrically connected to the memory elements.

4. The method according to claim 3, which comprises:

after producing the transistors, producing an insulating layer in which the contacts are produced;

etching, with an aid of a strip-type mask which partially overlaps the contacts, the insulating layer; and subsequently depositing a conductive material and one of etching back and planarizing the conductive material such that the writes lines are produced.

5. The method according to claim 4, which comprises cutting through the insulating layer until the gate lines are uncovered.

* * * * *

UNITED STATES PATENT AND TRADEMARK OFFICE
CERTIFICATE OF CORRECTION

PATENT NO. : 6,379,978 B2
DATED : April 30, 2002
INVENTOR(S) : Bernd Goebel et al.

It is certified that error appears in the above-identified patent and that said Letters Patent is hereby corrected as shown below:

<u>Title page,</u>
Item [30], should read as follows:
-- July 15, 1998        (DE)............................198 31 820.0 --

Signed and Sealed this

Eighteenth Day of June, 2002

Attest:

JAMES E. ROGAN
Director of the United States Patent and Trademark Office

Attesting Officer